(12) United States Patent
Luby et al.

(10) Patent No.: US 7,721,184 B2
(45) Date of Patent: May 18, 2010

(54) METHOD AND APPARATUS FOR FAST ENCODING OF DATA SYMBOLS ACCORDING TO HALF-WEIGHT CODES

(75) Inventors: Michael Luby, Berkeley, CA (US); M. Amin Shokrollahi, San Jose, CA (US)

(73) Assignee: Digital Fountain, Inc., San Diego, CA (US)

( * ) Notice: Subject to any disclaimer, the term of this patent is extended or adjusted under 35 U.S.C. 154(b) by 899 days.

(21) Appl. No.: 11/202,933

(22) Filed: Aug. 11, 2005

(65) Prior Publication Data

US 2006/0036930 A1    Feb. 16, 2006

Related U.S. Application Data

(60) Provisional application No. 60/600,932, filed on Aug. 11, 2004.

(51) Int. Cl.
  *H03M 13/00* (2006.01)
(52) U.S. Cl. .................................................. 714/781
(58) Field of Classification Search .................. 714/781
  See application file for complete search history.

(56) References Cited

U.S. PATENT DOCUMENTS

| | | | |
|---|---|---|---|
| 4,365,338 A | 12/1982 | McRae et al. |
| 4,589,112 A | 5/1986 | Karim |
| 3,909,721 A | 9/1987 | Bussgang et al. |
| 5,331,320 A | 7/1994 | Cideciyan et al. |
| 5,432,787 A | 7/1995 | Chethik |
| 5,455,823 A | 10/1995 | Noreen et al. |
| 5,608,738 A | 3/1997 | Matsushita |
| 5,617,541 A | 4/1997 | Albanese et al. |
| 5,805,825 A | 9/1998 | Danneels et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,044,485 A | 3/2000 | Dent et al. |
| 6,073,250 A | 6/2000 | Luby et al. |
| 6,081,909 A | 6/2000 | Luby et al. |
| 6,081,918 A | 6/2000 | Spielman |

(Continued)

FOREIGN PATENT DOCUMENTS

| | | |
|---|---|---|
| EP | 0854650 | 7/1998 |
| WO | 96034463 | 10/1996 |
| WO | 98032231 | 7/1998 |
| WO | 00018017 | 3/2000 |

OTHER PUBLICATIONS

Alon, N. et al.: "Linear Time Erasure Codes with Nearly Optimal Recovery (Extended Abstract)," Proceedings of the Annual Symposium on Foundations of Computer Science, US. Los Alamitos, IEEE Comp. Soc. Press, vol. Symp. 36, pp. 512-516 (Oct. 23, 1995) XP000557871.

(Continued)

*Primary Examiner*—Joseph D Torres
(74) *Attorney, Agent, or Firm*—Jeffrey D. Jacobs

(57) ABSTRACT

Efficient methods for encoding and decoding Half-Weight codes are disclosed and similar high density codes are disclosed. The efficient methods require at most $3\cdot(k-1)+h/2+1$ XORs of symbols to calculate h Half-Weight symbols from k source symbols, where h is of the order of $\log(k)$.

6 Claims, 14 Drawing Sheets

U.S. PATENT DOCUMENTS

| | | | |
|---|---|---|---|
| 6,097,320 | A | 8/2000 | Kuki et al. |
| 6,163,870 | A | 12/2000 | Luby et al. |
| 6,178,536 | B1 | 1/2001 | Sorkin |
| 6,195,777 | B1 | 2/2001 | Luby et al. |
| 6,223,324 | B1 | 4/2001 | Sinha et al. |
| 6,307,487 | B1 | 10/2001 | Luby et al. |
| 6,320,520 | B1 | 11/2001 | Luby et al. |
| 6,333,926 | B1 | 12/2001 | Van Heeswyk et al. |
| 6,373,406 | B2 | 4/2002 | Luby et al. |
| 6,411,223 | B1 | 6/2002 | Haken et al. |
| 6,420,982 | B1 | 7/2002 | Brown |
| 6,430,233 | B1 | 8/2002 | Dillon et al. |
| 6,473,010 | B1 | 10/2002 | Vityaev |
| 6,486,803 | B1 | 11/2002 | Luby et al. |
| 6,643,332 | B1 | 11/2003 | Morelos-Zaragoza et al. |
| 6,742,154 | B1 | 5/2004 | Barnard |
| 6,849,803 | B1 | 2/2005 | Gretz |
| 6,850,736 | B2 | 2/2005 | McCune, Jr. |
| 6,856,263 | B2 | 2/2005 | Shokrollahi et al. |
| 6,909,383 | B2 | 6/2005 | Shokrollahi et al. |
| 7,030,785 | B2 | 4/2006 | Shokrollahi et al. |
| 7,068,729 | B2 | 6/2006 | Shokrollahi et al. |
| 7,418,651 | B2* | 8/2008 | Luby et al. ............... 714/800 |
| 2007/0195894 | A1* | 8/2007 | Shokrollahi et al. ......... 375/242 |
| 2007/0300127 | A1* | 12/2007 | Watson et al. ............... 714/758 |

OTHER PUBLICATIONS

Bigloo. A. et al,: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 917-624 XP0000464977.

Bitner. J.R., et al.: "Efficient generation of the binary reflected Gray code and its Applications," Communications of the ACM (1976).

Blomer, J. et al.: "An XOR-Based Erasure-Resilient Coding Scheme, " ICSI Technical Report No. TR-95-048 (1995).

Byers, J. et al.: "A Digital Fountain Approach to Reliable Distribution of Bulk Data," 1998, Computer Communication Review Association for Computing Machinery, vol.28, No. 4, pp. 56-67.

Byers, J. et al.: "Accessing Multiple Mirror Sites in Parallel: Using Tornado Codes to Speed Up Downloads," 1999, Eighteenth Annual Joint Conference of the IEEE Computer and Communications Societies, pp. 275-283.

Clark, G. C. et al.: "Error Correction Coding for Digital Communications System Applications, " 1981, Plenum Press New York, pp. 339-341.

Digital Fountain: "Raptor code specifications for MBMS file download, " 3GPP SA4 PSM AD-HOC #31 (May 21, 2004) XP002355055 pp. 1-6.

Digital Fountain: "Specification Text for Raptor Forward Error Correction," TDOC S4-050249 OF 3GPP TSG SA WG 4 Meeting #34 [Online](Feb. 25, 2005) pp. 1-23, XP002425167. Retrieved from the Internet: URL:http://www.3gpp.org/ftp/tsg_sa/WG4_CODEC/TSGS4_34/Docs.

Esaki, et al.: "Reliable IP Multicast Communication Over ATM Networks Using Forward Error Correction Policy, " IEICE Transactions on Communications, JP, Institute of Electronics Information and Comm. ENG. Tokyo, vol. E78-V. No. 12 (Dec. 1, 1995) pp. 1622-1637.

Luby, M. et al.: "Analysis of Random Processes via And-Or Tree Evaluation, "ICSI Technical Report No. TR-97-042 (1997) and Proceedings of the 9th Annual ACM Symposium on Discrete Algorithms (1998).

Luby, M. et al.: "Improved Low-Density Parity-Check Codes Using Irregular Graphs and Belief Propagation," International Computer Science Institute Technical Report TR-97-044 (Nov. 1997).

Luby, M. et al.: "Practical Loss-Resilient Codes: Tornado Codes," 29th Annual ACM Symposium on Theory of Computing (1997).

Luby, M. et al.: "Analysis of Low Density Codes and Improved Designs Using Irregular Graphs." 1998, Proceedings of the 30th Annual ACM Symposium on Theory.

Luby, M. et al.: "Efficient Erasure Correction Codes," 2001. IEEE Transactions on Information Theory, vol. 47. No. 2. pp. 569-584.

Pursley, M. et al. "A Correction and an Addendum for Variable-Rate Coding for Meteor-Burst Communications." IEEE Transactions on Communications. vol. 43. No., 12 pp. 2866-2867 (Dec. 1995).

Pursley. M. et al.: "Variable-Rate Coding for Meteor-Burst Communications." IEEE Transactions on Communications, vol. 37, No. 11, pp. 1105-1112 (Nov. 1989) XP000074533 Issn: 0090-6778.

Rizzo, L.: "Effective Erasure Codes for Reliable Computer Communication Protocols, " Computer Communication Review, Association for Computing Machinery, vol. 27, No. 2, pp. 24-36, (Apr. 1997).

Seshan. S. et al.: "Handoffs in Cellular Wireless Networks: The Daedalus Implementation and Experience," Wireless Personal Communications. NL: Kluwer Scademic Publishers. vol. 4. No. 2 (Mar. 1, 1997) pp. 141-162, XP000728589.

Shacham, N.: "Packet Recovery and Error Correction in High-Speed Wide-Area Networks." Proceedings of the Military Communications Conferences (Milcom), US, New York, IEEE. vol. 1, pp. 551-557 (1989) XP000131876.

Shokrollhai. A.: "Raptor Codes," Internet Citation [Online] (Jan. 13, 2004) XP002367883. Retrieved from the Internet: URL:http://www.cs.huji.ac.il/labs/danss/p2p/resources/raptor.pdf.

Lin, S. et al.: "Error Control Coding-Fundamentals and Applications, " 1983, Englewood Cliffs, pp. 288.

Gemmell, et al., "A Scalable Multicast Architecture for one-to-many Telepresentations", Multimedia Computing and Systems, 1998/ Proceedings, IEEE International Conference on Austin, TX, USA Jun. 28 - Jul. 1, 1998, Los Alamitos, CA. USA, IEEE Comput. Soc. US.

Hershey, et al., "Random Parity Coding (RPC)" 1998 IEEE International Conference on Communications (ICC). Converging Technologies for Tomorrows Applications. Dallas. June 23-27, 1996. IEEE International Conference on Communications (ICC), New York, IEEE.

Kallel, "Complementary Punctured Convolutional (CPC) Codes and Their Applications", IEEE Transactions on Communications, IEEE Inc., New York, US. vol. 43, No. 6., Jun. 1, 1995: pp. 2005-2009.

Narayanan, et al.,"Physical Layer Design For Packet Data Over IS-136", Vehicular Technology Conference, 1997, IEEE 47th Phoenix, AZ., USA May 4-7, 1997, New York, NY, USA, IEEE, US May 4, 1997, pp. 1029-1033.

Nonnenmacher, et al., "Parity-Based Loss Recovery for Reliable Multicast Transmission", IEEE/ACM Transactions on Networking, IEEE Inc. New York, US, vol. 6, No. 4, Aug. 1, 1998, pp. 349-361.

International Search, Report, PCTIUS2005/028668 International Search Authority, US. Jun. 7, 2007.

InternatIonal Preliminary Report on Patentability, PCT/US2005/028668 - The International Bureau of WIPO — Geneva, Switzerland, Jun. 26, 2007.

Written Opinion, PCT/US2005/028668 — International Search Authority — European Patent Office, Jun. 7, 2007.

* cited by examiner

| i [binary] | g[i] [binary] |
|---|---|
| 0 0 0 0 0 | 0 0 0 0 0 |
| 0 0 0 0 1 | 0 0 0 0 1 |
| 0 0 0 1 0 | 0 0 0 1 1 |
| 0 0 0 1 1 | 0 0 0 1 0 |
| 0 0 1 0 0 | 0 0 1 1 0 |
| 0 0 1 0 1 | 0 0 1 1 1 |
| 0 0 1 1 0 | 0 0 1 0 1 |
| 0 0 1 1 1 | 0 0 1 0 0 |
| 0 1 0 0 0 | 0 1 1 0 0 |
| 0 1 0 0 1 | 0 1 1 0 1 |
| 0 1 0 1 0 | 0 1 1 1 1 |
| 0 1 0 1 1 | 0 1 1 1 0 |
| 0 1 1 0 0 | 0 1 0 1 0 |
| 0 1 1 0 1 | 0 1 0 1 1 |
| 0 1 1 1 0 | 0 1 0 0 1 |
| 0 1 1 1 1 | 0 1 0 0 0 |
| 1 0 0 0 0 | 1 1 0 0 0 |
| 1 0 0 0 1 | 1 1 0 0 1 |
| 1 0 0 1 0 | 1 1 0 1 1 |
| 1 0 0 1 1 | 1 1 0 1 0 |
| 1 0 1 0 0 | 1 1 1 1 0 |
| 1 0 1 0 1 | 1 1 1 1 1 |
| 1 0 1 1 0 | 1 1 1 0 1 |
| 1 0 1 1 1 | 1 1 1 0 0 |

Figure 10 column index 4 3 2 1 0

|  | 4 | 3 | 2 | 1 | 0 |
|---|---|---|---|---|---|
| 0 | 0 | 0 | 1 | 1 | 1 |
| 1 | 0 | 1 | 1 | 0 | 1 |
| 2 | 0 | 1 | 1 | 1 | 0 |
| 3 | 0 | 1 | 0 | 1 | 1 |
| 4 | 1 | 1 | 0 | 0 | 1 |
| 5 | 1 | 1 | 0 | 1 | 0 |
| 6 | 1 | 1 | 1 | 0 | 0 | row index (rows 0–6)

METHOD AND APPARATUS FOR FAST ENCODING OF DATA SYMBOLS ACCORDING TO HALF-WEIGHT CODES

CROSS-REFERENCES TO RELATED APPLICATIONS

This application claims priority from U.S. Provisional Patent Application No. 60/600,932 filed Aug. 11, 2004 for Luby et al. "File Download System Using Fountain Codes" (hereinafter "Luby-Prov") which is hereby incorporated by reference, as if set forth in full in this document, for all purposes.

Related applications with common assignment include U.S. Pat. No. 6,307,487 to Luby entitled "Information Additive Code Generator and Decoder for Communication Systems" (hereinafter "Luby I"), U.S. patent application Ser. No. 10/032,156 filed Dec. 21, 2001 for Shokrollahi et al., entitled "Multi-Stage Code Generator and Decoder for Communication Systems" (hereinafter "Shokrollahi I") and U.S. patent application Ser. No. 11/125,818 filed May 9, 2005 for Luby et al., entitled "File Download System" (hereinafter "Luby05"), each of which is hereby incorporated by reference, as if set forth in full in this document, for all purposes.

BACKGROUND OF THE INVENTION

The present invention relates to systems and methods for encoding and/or decoding data, and more particularly to systems and methods for encoding and/or decoding using multi-stage fountain codes, herein referred to collectively as "MS Codes."

Fountain codes have been described previously such as in Luby I, Shokrollahi I and Luby05. As described therein, sometimes referred to "chain reaction codes" in view of some of the decoding techniques, fountain codes provide a form of forward error-correction that enables data reconstruction from a received data set of a given size, without regard to the particular data packets received and provide for sequences of encoded that does not need to repeat over normal use, such that a set of data can be encoded with a fountain code to generate as much output sequence data as needed. Unlike many coding techniques that generate a fixed amount of output for a given input and thus have a predetermined "code rate", fountain codes can be "rateless" codes. Fountain codes are often considered information additive codes in that randomly selected output symbols are likely to contribute (add) information to other randomly selected output symbols, whereas random selections of among fixed rate code symbols are more likely to be duplicative of selections already received.

As a result, communication systems employing fountain codes are able to communicate information much more efficiently compared to traditional FEC codes transmitted via data carousel or acknowledgement-based protocols, as described in Luby I, or Shokrollahi I or Luby05.

Transmission of data between a sender and a recipient over a communications channel has been the subject of much literature. Preferably, but not exclusively, a recipient desires to receive an exact copy of data transmitted over a channel by a sender with some level of certainty. Where the channel does not have perfect fidelity (which covers most of all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected, a simple parity code might be best.

Data transmission between multiple senders and/or multiple receivers over a communications channel has also been the subject of much literature. Typically, data transmission from multiple senders requires coordination among the multiple senders to allow the senders to minimize duplication of efforts. In a typical multiple sender system sending data to a receiver, if the senders do not coordinate which data they will transmit and when, but instead just send segments of the file, it is likely that a receiver will receive many useless duplicate segments. Similarly, where different receivers join a transmission from a sender at different points in time, a concern is how to ensure that all data the receivers receive from the sender is useful. For example, suppose the sender is wishes to transmit a file, and is continuously transmitting data about the same file. If the sender just sends segments of the original file and some segments are lost, it is likely that a receiver will receive many useless duplicate segments before receiving one copy of each segment in the file. Similarly, if a segment is received in error multiple times, then the amount of information conveyed to the receiver is much less than the cumulative information of the received garbled data. Often this leads to undesirable inefficiencies of the transmission system, or may require transmitter and/or receiver coordination.

Often data to be transmitted over a communications channel is partitioned into equal size input symbols. The "size" of an input symbol can be measured in bits, whether or not the input symbol is actually broken into a bit stream, where an input symbol has a size of M bits when the input symbol is selected from an alphabet of $2^M$ symbols.

A coding system may produce output symbols from the input symbols. Output symbols are elements from an output symbol alphabet. The output symbol alphabet may or may not have the same characteristics as the alphabet for the input symbols. Once the output symbols are created, they are transmitted to the receivers.

The task of transmission may include post-processing of the output symbols so as to produce symbols suitable for the particular type of transmission. For example, where transmission constitutes sending the data from a wireless provider to a wireless receiver, several output symbols may be lumped together to form a frame, and each frame may be converted into a wave signal in which the amplitude or the phase is related to the frame. The operation of converting a frame into a wave is often called modulation, and the modulation is further referred to as phase or amplitude modulation depending on whether the information of the wave signal is stored in its phase or in its amplitude. Nowadays this type of modulated transmission is used in many applications, such as satellite transmission, cable modems, Digital Subscriber Lines (DSL), and many others.

A transmission is called reliable if it allows the intended recipient to recover an exact copy of the original data even in the face of errors and/or erasures during the transmission. Recovery of erased information has been the subject of much literature and very efficient coding methods have been devised in this case. Fountain codes, as described in Luby I or Shokrollahi I or Luby05, are efficient coding methods for recovery of erasures in a wide variety of settings.

One solution that has been proposed to increase reliability of transmission is to use Forward Error-Correction (FEC) codes, such as Reed-Solomon codes, Tornado codes, or, more generally, LDPC ("low density parity codes"). With such codes, one sends output symbols generated from the content instead of just sending the input symbols that constitute the content. Traditional error correcting codes, such as Reed-Solomon or other LDPC codes, generate a fixed number of output symbols for a fixed length content. For example, for K input symbols, N output symbols might be generated. These N output symbols may comprise the K original input symbols and N-K redundant symbols. If storage permits, then the sender can compute the set of output symbols for each piece of data only once and transmit the output symbols using a carousel protocol.

One problem with some FEC codes is that they require excessive computing power or memory to operate. Another problem is that the number of output symbols must be determined in advance of the coding process. This can lead to inefficiencies if the error rate of the symbols is overestimated, and can lead to failure if the error rate is underestimated. Moreover, traditional FEC schemes often require a mechanism to estimate the reliability of the communications channel on which they operate. For example, in wireless transmission the sender and the receiver are in need of probing the communications channel so as to obtain an estimate of the noise and hence of the reliability of the channel. In such a case, this probing has to be repeated quite often, since the actual noise is a moving target due to rapid and transient changes in the quality of the communications channel.

For traditional FEC codes, the number of valid output symbols that can be generated is of the same order of magnitude as the number of input symbols the content is partitioned into and is often a fixed ratio called the "code rate." Typically, but not exclusively, most or all of these output symbols are generated in a preprocessing step before the sending step. These output symbols often have the property that all the input symbols can be regenerated from any subset of the output symbols equal in length to the original content or slightly longer in length than the original content. Typically, a code rate is selected to match an expected error rate.

Fountain decoding is a form of forward error-correction that addresses the above issues in cases where a transmission error constitutes an erasure. For fountain codes, the pool of possible output symbols that can be generated is orders of magnitude larger than the number of the input symbols typically limited only by a resolution of a counter on the encoder rather than by a code rate, and a random output symbol from the pool of possibilities can be generated very quickly. For fountain codes, the output symbols can be generated on the fly on an as needed basis concurrent with the sending step. Fountain codes have a property that all input symbols of the content can be regenerated from any subset of a set of randomly generated and/or selected output symbols slightly longer in length than the original content.

Other descriptions of various fountain coding systems can be found in documents such as U.S. Pat. No. 6,486,803, entitled "On Demand Encoding with a Window" and U.S. Pat. No. 6,411,223 entitled "Generating High Weight Output Symbols using a Basis," assigned to the assignee of the present application.

Some embodiments of a fountain coding system comprise an encoder and a decoder. Data may be presented to the encoder in the form of a block, or a stream, and the encoder may generate output symbols from the block or the stream on the fly. In some embodiments, for example those described in Shokrollahi I and Luby05, data may be pre-encoded off-line, or concurrently with the process of transmission, using a static encoder, and the output symbols may be generated from the static input symbols, defined as the plurality of the original data symbols, and the output symbols of the static encoder.

In general, the block or stream of symbols from which the dynamic output symbols are generated is referred to herein as "source symbols." Thus, in the case of the codes described in Shokrollahi I and Luby05, the source symbols are the static input symbols, while for codes described in Luby I, the source symbols are the input symbols. The term "input symbols" herein refers to the original symbols presented to the encoder for encoding. Thus, for chain reaction codes described in Luby I, the source symbols are identical with input symbols. Sometimes, to distinguish between an MS code, as for example one of the codes described in Shokrollahi I or Luby05, and the codes described in Luby I, we will refer herein to the output symbols generated by a coding system employing an MS code as the "dynamic output symbols."

In certain applications, it may be preferable to transmit the input symbols first, and then continue transmission by sending generated output symbols. Such a coding system is called a systematic coding system and systematic coding systems for codes such as those described in Luby I and Shokrollahi I are disclosed in U.S. Pat. No. 6,909,383 entitled, "Systematic Encoding and Decoding of Chain Reaction Codes," assigned to the assignee of the present application (hereinafter "Systematic MS"), whereas Luby05 is itself a systematic MS code that is designed using the elements described in "Systematic MS".

Various methods for generating source symbols from the input symbols are described in Shokrollahi I and Luby05. Generally, but not exclusively, the source symbols are preferably generated efficiently on a data processing device, and, at the same time, a good erasure correcting capability is required of the multi-stage code. One of the teachings in Shokrollahi I and Luby05 is to use a combination of codes to produce the source symbols. In one particular embodiment described in Luby05, this combination comprises using an LDPC code to produce a second set of source symbols from the input symbols (the input symbols are the first set of source symbols) and then using a Half-Weight encoder to produce a third set of source symbols from the first two sets of source symbols, and then the dynamic output symbols are calculated based on all three sets of source symbols.

Other methods and processes for both the generation of source symbols and dynamic output symbols, and the decoding of these output symbols, have been described in U.S. Pat. No. 6,856,263 entitled "Systems and Processes for Decoding a Chain Reaction Code Through Inactivation," assigned to the assignee of the present application (hereinafter "Inactivation Decoding"). One advantage of a decoder according teachings Inactivation Decoding over a multi-stage chain reaction decoder described in Shokrollahi I is that an inactivation decoding decoder has typically a lower probability of error.

The encoding for an MS encoder in some embodiments can be partitioned into two stages. The first stage computes redundant symbols from the original input symbols, and the second stage generates output symbols from combinations of the original input symbols and redundant symbols. In some embodiments of an MS encoder, the first stage can be further partitioned into two or more steps, where some of these steps compute redundant symbols based on Low Density Parity Check (LDPC) codes or other codes, and where other steps compute redundant symbols based on other codes. To lower the probability of error of the decoder, both multi-stage fountain decoding and some embodiments of decoding described in Inactivation Decoding may make use of a Half-Weight code in these other steps, and thus a Half-Weight code is used in these embodiments in one of the primary stages of static encoding.

The techniques of multi-stage encoding, multi-stage fountain decoding and Inactivation Decoding may also be applied to other forward error correction codes including LDPC ("low density parity check") codes, IRA ("Irregular Repeat Accumulate") code, AIRA ("Accumulate Irregular Repeat Accumulate") codes, and LDGM ("low density generator matrix") codes, and many other classes of codes based on graphs, and thus the techniques described herein for Half-Weight code generation may also be applied in those settings.

As described in Luby05, a Half-Weight code generates, for a given number k of first source symbols, a number h of redundant symbols (referred to as the "Half-Weight symbols" hereinafter). The number h is the smallest integer with the property illustrated in Equation 1, where for positive integers i and j with i>j, the function choose(i, j) is equal to $i!/((i-j)! \cdot j!)$ and $n! = 1 \cdot 2 \cdot \ldots \cdot (n-1) \cdot n$, and where for real-valued x the function ceil(x) is the smallest integer greater than or equal to x.

$$\text{choose}(h, \text{ceil}(h/2)) \geq k \qquad \text{(Equ. 1)}$$

As described in Luby05, Half-Weight symbols can be calculated in a specific way from the k source symbols. Using the straightforward method for the computation of these symbols, each Half-Weight symbol requires, on average, around k/2 XORs of source symbols, and thus, in total, the h Half-Weight symbols require around $(k/2) \cdot h$ XORs of source symbols. Since h is of the order log(k), this amounts to roughly $k \cdot \log(k)/2$ XORs of input symbols for the calculation of the Half-Weight symbols. Taking into account that other redundant symbols calculated via, for example LDPC encoding, require much less computational time, the calculation of the Half-Weight symbols using the straightforward approach would constitute a computational bottleneck for the design of some embodiments of reliable multi-stage encoders.

What is therefore needed is an apparatus or process for calculating the Half-Weight symbols that is much more efficient than the straightforward one, and can be implemented easily on various computing devices.

BRIEF SUMMARY OF THE INVENTION

In embodiments of encoders and/or decoders according to the present invention, efficient methods for encoding and decoding Half-Weight codes and similar high density codes are disclosed. Such efficient methods can operate with at most $3 \cdot (k-1) + h/2 + 1$ XORs of symbols to calculate h Half-Weight symbols from k source symbols, where h is of the order of log(k).

According to one embodiment of the invention, a method of encoding data operates on an ordered set of input symbols and includes generating intermediate symbols from the set of input symbols and possibly a set of a plurality of redundant symbols from the intermediate symbols. The method also includes generating a plurality of output symbols from a combined set of symbols including the input symbols, the intermediate symbols and possibly the redundant symbols. The intermediate symbols might include a plurality of Half-Weight symbols wherein their number is a function of the number of input symbols.

According to still another embodiment of the invention, a system for receiving data transmitted from a source over a communications channel is provided using similar techniques. The system comprises a receive module coupled to a communications channel for receiving output symbols transmitted over the communications channel, including a decoder for Half-Weight symbols.

According to yet another embodiment of the invention, a computer data signal embodied in a carrier wave is provided, wherein Half-Weight symbols are encoded.

Numerous benefits are achieved by way of the present invention. For example, in a specific embodiment, the computational expense of encoding data for transmission over a channel is reduced. In another specific embodiment, the computational expense of decoding such data is reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

BRIEF DESCRIPTION OF THE DRAWINGS

FIG. 10 is an illustration of an example of the first few elements of a Gray code sequence.

FIG. 11 is an illustration of an example of a Half-Weight matrix H.

DETAILED DESCRIPTION OF THE INVENTION

Figure 1:
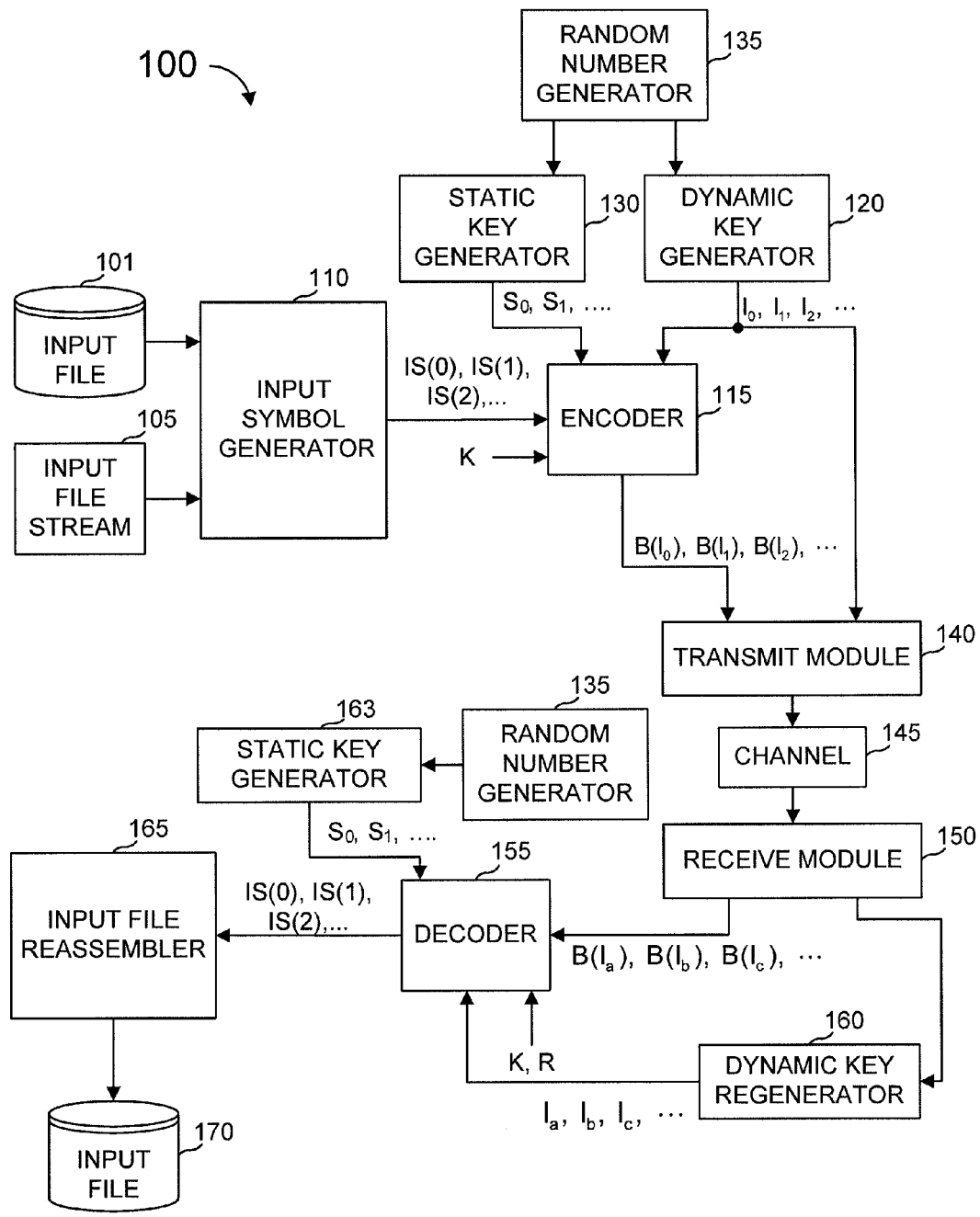
FIG. 1 is a block diagram of a communications system according to one embodiment wherein the present invention might be used.

In the specific embodiments described herein, a coding scheme denoted as "multi-stage coding" is described, embodiments of which are provided in Shokrollahi I.

Multi-stage encoding encodes the data in a plurality of stages. Typically, but not always, a first stage adds a predetermined amount of redundancy to the data. A second stage then uses a fountain code, or the like, to produce output symbols from the original data and the redundant symbols computed by the first stage of the encoding. The first stage's redundancy might be in the form of LDPC symbols, Half-Weight symbols, source symbols, etc.

As used herein, input symbols are data that an encoder seeks to encode such that a decoder can recover those input symbols. In some multi-stage encoders described herein, a pre-coder generates a set of intermediate symbols from the input symbols using some control inputs known to the encoder and to the decoder (at least when the decoder is tasked with decoding information that depends on knowing those control inputs). A next stage might generate a set of redundant symbols from the intermediate symbols, which might include Half-Weight symbols. The input symbols and the redundant symbols might then collectively form a set of source symbols that form input to a dynamic encoder such as a fountain encoder. For systematic coding, the source symbols include the input symbols, whereas for nonsystematic coding, the source symbols contain less than all or none of the input symbols and rely more on redundant symbols. In the latter case, the redundant symbols might not be referred to as redundant, but just as being source symbols. Furthermore, in some embodiments the labels "intermediate symbol" and "redundant symbol" are interchangeable and the source symbols comprise input symbols and redundant/intermediate symbols.

In some embodiments, the output symbols can be generated from source symbols as needed or based on a maximum anticipated error rate. In embodiments in which the second stage comprises fountain encoding, each output symbol can be generated without regard to how other output symbols are generated, in part because they can be generated statistically with high likelihood of information additivity between independently generated output symbols due to the large key alphabet. Once generated, these output symbols can then be placed into packets and transmitted to their destination, with each packet containing one or more output symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

As used herein, the term "stream" refers to any data that is stored or generated at one or more sources and is delivered at a specified rate at each point in time in the order it is generated to one or more destinations. Streams can be fixed rate or variable rate. Thus, an MPEG video stream, AMR audio stream, and a data stream used to control a remote device, are all examples of "streams" that can be delivered. The rate of the stream at each point in time can be known (such as 4 megabits per second) or unknown (such as a variable rate stream where the rate at each point in time is not known in advance). Either way, the stream is a sequence of input symbols, where each input symbol has a position in the stream and a value. Transmission is the process of transmitting data from one or more senders to one or more recipients through a channel in order to deliver a file or stream. A sender is also sometimes referred to as the encoder. If one sender is connected to any number of recipients by a perfect channel, the received data can be an exact copy of the input file or stream, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing an input file or stream and start the transmission before a recipient is in range. Once the recipient is in range, data can be received until the satellite moves out of range, at which point the recipient can redirect its satellite dish (during which time it is not receiving data) to start receiving the data about the same input file or stream being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file or stream, but instead to transmit data generated from the input file or stream (which could include all or parts of the input file or stream itself) that assists with recovery of erasures. An encoder is a circuit, device, module or code segment that handles that task. One way of viewing the operation of the encoder is that the encoder generates output symbols from input symbols, where a sequence of input symbol values represents the input file or a block of the stream. Each input symbol would thus have a position, in the input file or block of the stream, and a value. A decoder is a circuit, device, module or code segment that reconstructs the input symbols from the output symbols received by the recipient. In multi-stage coding, the encoder and the decoder are further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of input symbols, wherein the number of redundant symbols is determined prior to encoding. Examples of static encoding codes include Reed-Solomon codes, Tornado codes, Hamming codes, Low Density Parity Check (LDPC) codes, etc. The term "static decoder" is used herein to refer to a decoder that can decode data that was encoded by a static encoder. For some encoders, the input symbols are used to generate intermediate symbols, which are used to generate the source symbols and the intermediate symbols are not transmitted.

As used herein, a "dynamic encoder" is an encoder that generates output symbols from a set of input symbols, where the number of possible output symbols is orders of magnitude larger than the number of input symbols, and where the number of output symbols to be generated need not be fixed. One example of a dynamic encoder is a chain reaction encoder, such as the encoders described in Luby I and Luby05. The term "dynamic decoder" is used herein to refer to a decoder that can decode data that was encoded by a dynamic encoder.

Embodiments of multi-stage coding need not be limited to any particular type of input symbol. Typically, the values for the input symbols are selected from an alphabet of $2^M$ symbols for some positive integer M. In such cases, an input symbol can be represented by a sequence of M bits of data from the input file or stream. The value of M is often determined based on, for example, the uses of the application, the communication channel, and/or the size of the output symbols. Additionally, the size of an output symbol is often determined based on the application, the channel, and/or the size of the input symbols. In some cases, the coding process might be simplified if the output symbol values and the input symbol values were the same size (i.e., representable by the same number of bits or selected from the same alphabet). If that is the case, then the input symbol value size is limited when the output symbol value size is limited. For example, it may be desired to put output symbols in packets of limited size. If some data about a key associated with the output symbols were to be transmitted in order to recover the key at the receiver, the output symbol would preferably be small enough to accommodate, in one packet, the output symbol value and the data about the key.

As an example, if an input file is a multiple megabyte file, the input file might be broken into thousands, tens of thousands, or hundreds of thousands of input symbols with each input symbol encoding thousands, hundreds, or only few bytes. As another example, for a packet-based Internet channel, a packet with a payload of size of 1024 bytes might be appropriate (a byte is 8 bits). In this example, assuming each packet contains one output symbol and 8 bytes of auxiliary information, an output symbol size of 8128 bits ($(1024-8)*8$) would be appropriate. Thus, the input symbol size could be chosen as $M=(1024-8)*8$, or 8128 bits. As another example, some satellite systems use the MPEG packet standard, where the payload of each packet comprises 188 bytes. In that example, assuming each packet contains one output symbol and 4 bytes of auxiliary information, an output symbol size of 1472 bits ($(188-4)*8$), would be appropriate. Thus, the input symbol size could be chosen as $M=(188-4)*8$, or 1472 bits. In a general-purpose communication system using multi-stage coding, the application-specific parameters, such as the input symbol size (i.e., M, the number of bits encoded by an input symbol), might be variables set by the application.

As another example, for a stream that is sent using variable size source packets, the symbol size might be chosen to be rather small so that each source packet can be covered with an integral number of input symbols that have aggregate size at most slightly larger than the source packet.

Each output symbol has a value. In one preferred embodiment, which we consider below, each output symbol also has associated therewith an identifier called its "key." Preferably, the key of each output symbol can be easily determined by the recipient to allow the recipient to distinguish one output symbol from other output symbols. Preferably, the key of an output symbol is distinct from the keys of all other output symbols. There are various forms of keying discussed in previous art. For example, Luby I describes various forms of keying that can be employed in embodiments of the present invention.

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of fountain coding described in Luby I. In particular, multi-stage output symbols are information additive, so any suitable number of packets can be used to recover an input file or stream to a desired degree of accuracy.

These conditions do not adversely affect the communication process when multi-stage coding is used, because the output symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter.

With multi-stage coding, a receiver is not constrained to pickup any particular set of packets, so it can receive some packets from one transmitter, switch to another transmitter, lose some packets, miss the beginning or end of a given transmission and still recover an input file or block of a stream. The ability to join and leave a transmission without receiver-transmitter coordination helps to simplify the communication process. With suitable selection of the stages, it might be that a coding scheme will result in output symbols that can be more quickly decoded, or with less computational effort.

In some embodiments, transmitting a file or stream using multi-stage coding can include generating, forming or extracting input symbols from an input file or block of a stream, computing redundant symbols, encoding input and redundant symbols into one or more output symbols, where each output symbol is generated based on its key independently of all other output symbols, and transmitting the output symbols to one or more recipients over a channel. Additionally, in some embodiments, receiving (and reconstructing) a copy of the input file or block of a stream using multi-stage coding can include receiving some set or subset of output symbols from one of more data streams, and decoding the input symbols from the values and keys of the received output symbols.

Suitable FEC erasure codes as described herein can be used to overcome the above-cited difficulties and would find use in a number of fields including multimedia broadcasting and multicasting systems and services. An FEC erasure code hereafter referred to as "a multi-stage fountain code" has properties that meet many of the current and future requirements of such systems and services.

Some basic properties of multi-stage fountain codes are that, for any packet loss conditions and for delivery of source files of any relevant size or streams of any relevant rate: (a) reception overhead of each individual receiver device ("RD") is minimized; (b) the total transmission time needed to deliver source files to any number of RDs can be minimized (c) the quality of the delivered stream to any number of RDs can be maximized for the number of output symbols sent relative to the number of input symbols, with suitable selection of transmission schedules. The RDs might be handheld devices, embedded into a vehicle, portable (i.e., movable but not typically in motion when in use) or fixed to a location.

The amount of working memory needed for decoding is low and can still provide the above properties, and the amount of computation needed to encode and decode is minimal. In this document, we provide a simple and easy to implement description of some variations of multi-stage fountain codes.

Multi-stage chain reaction codes are fountain codes, i.e., as many encoding packets as needed can be generated on-the-fly, each containing unique encoding symbols that are equally useful for recovering a source file or block of a stream, while decoding often occurs in a chain reaction fashion, i.e., as one symbol is recovered, it might be the last remaining symbol needed to recover other symbols, which in turn might by the last remaining symbols to recover other symbols, etc.

There are many advantages to using fountain codes versus other types of FEC codes. One advantage is that, regardless of packet loss conditions and RD availability, fountain codes minimize the number of encoding packets each RD needs to receive to reconstruct a source file or block of a stream. This is true even under harsh packet loss conditions and when, for example, mobile RDs are only intermittently turned-on or available over a long file download session.

Another advantage is the ability to generate exactly as many encoding packets as needed, making the decision on how many encoding packets to generate on-the-fly while the transmission is in progress. This can be useful if for example there is feedback from RDs indicating whether or not they received enough encoding packets to recover a source file or block of a stream. When packet loss conditions are less severe than expected the transmission can be terminated early. When packet loss conditions are more severe than expected or RDs are unavailable more often than expected the transmission can be seamlessly extended.

Another advantage is the ability to inverse multiplex. Inverse multiplexing is when a RD is able to combine received encoding packets generated at independent senders to reconstruct a source file or block of a stream. One practical use of inverse multiplexing is described in below in reference to receiving encoding packets from different senders.

Where future packet loss, RD availability and application conditions are hard to predict, it is important to choose an FEC solution that is as flexible as possible to work well under unpredictable conditions. Multi-stage fountain codes provide a degree of flexibility unmatched by other types of FEC codes.

Aspects of the invention will now be described with reference to the figures.

System Overview

FIG. 1 is a block diagram of a communications system 100 that uses multi-stage coding. In communications system 100, an input file 101, or an input stream 105, is provided to an input symbol generator 110. Input symbol generator 110 generates a sequence of one or more input symbols (IS(0), IS(1), IS(2), ...) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file or stream. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0, S_1, \ldots$ The number of the static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file or block of a stream are unique. For example, Luby I describes embodiments of key generators that can be used. The outputs of dynamic key generator 120 and the static key generator 130 are provided to encoder 115.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly on or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 is also provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a dynamic key regenerator 160. Dynamic key regenerator 160 regenerates the dynamic keys for the received output symbols and provides these dynamic keys to decoder 155. Static key generator 163 regenerates the static keys $S_0, S_1, \ldots$ and provides them to decoder 155. The static key generator has access to random number generator 135 used both during the encoding and the decoding process. This can be in the form of access to the same physical device if the random numbers are generated on such device, or in the form of access to the same algorithm for the generation of random numbers to achieve identical behavior. Decoder 155 uses the keys provided by dynamic key regenerator 160 and static key generator 163 together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

An Encoder

Figure 2:
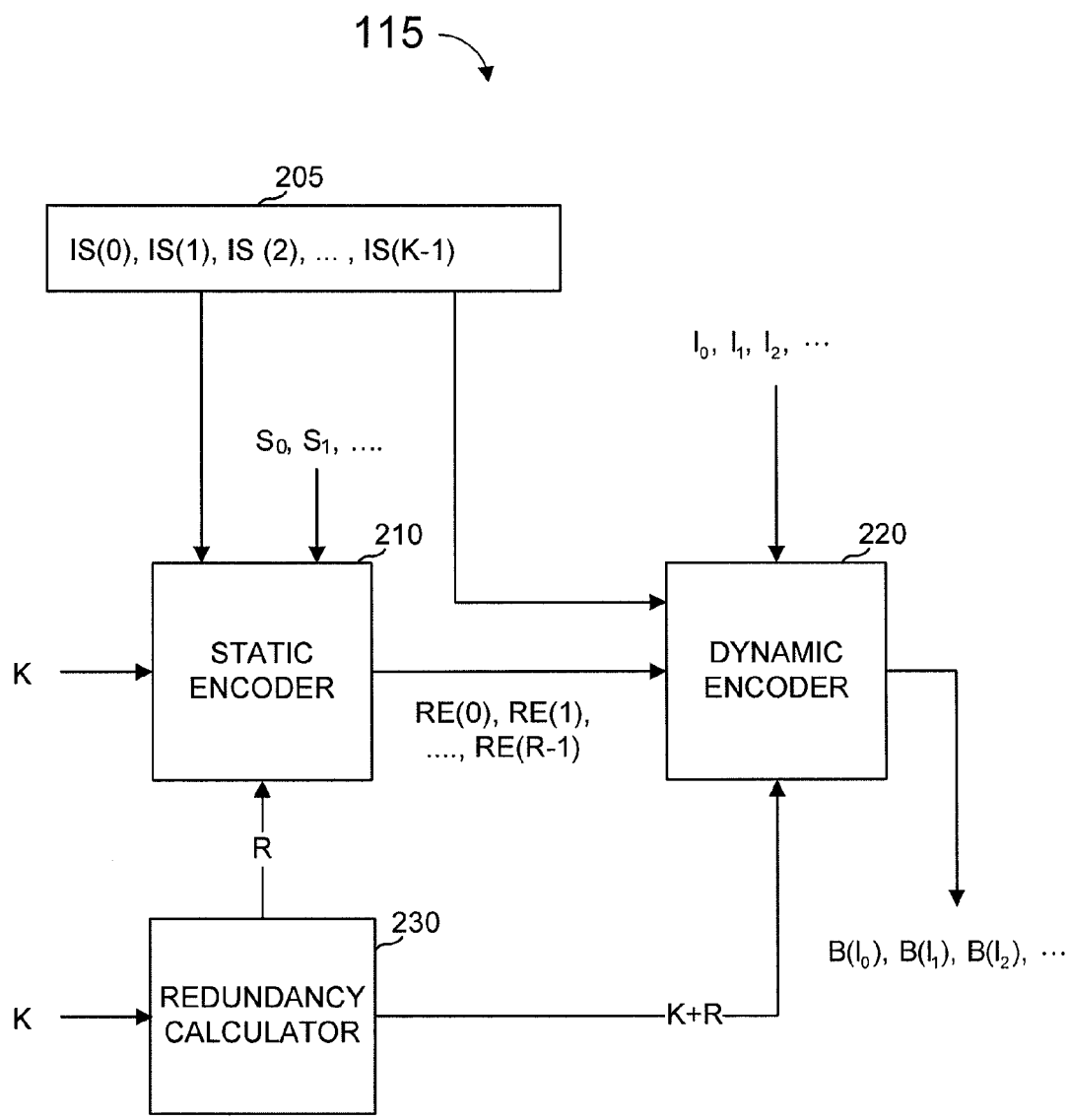
FIG. 2 is a block diagram of an encoder usable in the communication system of FIG. 1.

FIG. 2 is a block diagram of one specific embodiment of encoder 115 shown in FIG. 1. Encoder 115 comprises a static encoder 210, a dynamic encoder 220, and a redundancy calculator 230. Static encoder 210 receives the following inputs: a) original input symbols IS(0), IS(1), . . . , IS(K−1) provided by the input symbol generator 110 and stored in an input symbol buffer 205; b) the number K of original input symbols; c) static keys $S_0, S_1, \ldots$ provided by the static key generator 130; and d) a number R of redundant symbols.

Upon receiving these inputs static encoder 205 computes R redundant symbols RE(0), RE(1), . . . , RE(R−1) as will be described below. Typically, but not always, the redundant symbols have the same size as the input symbols. In one specific embodiment, the redundant symbols generated by static encoder 210 are stored in input symbol buffer 205. Input symbol buffer 205 may be only logical, i.e., the file or block of the stream may be physically stored in one place and the positions of the input symbols within symbol buffer 205 could only be renamings of the positions of these symbols within the original file or block of the stream. Some of the redundant symbols RE( ) might be Half-Weight symbols calculated as describe below.

Dynamic encoder receives the input symbols and the redundant symbols, and generates output symbols as will be described in further detail below. In one embodiment in which the redundant symbols are stored in the input symbol buffer 205, dynamic encoder 220 receives the input symbols and redundant symbols from input symbol buffer 205.

Redundancy calculator 230 computes the number R of redundant symbols from the number K of input symbols. This computation is described in further detail below.

Overview of Static Encoder

Figure 3:
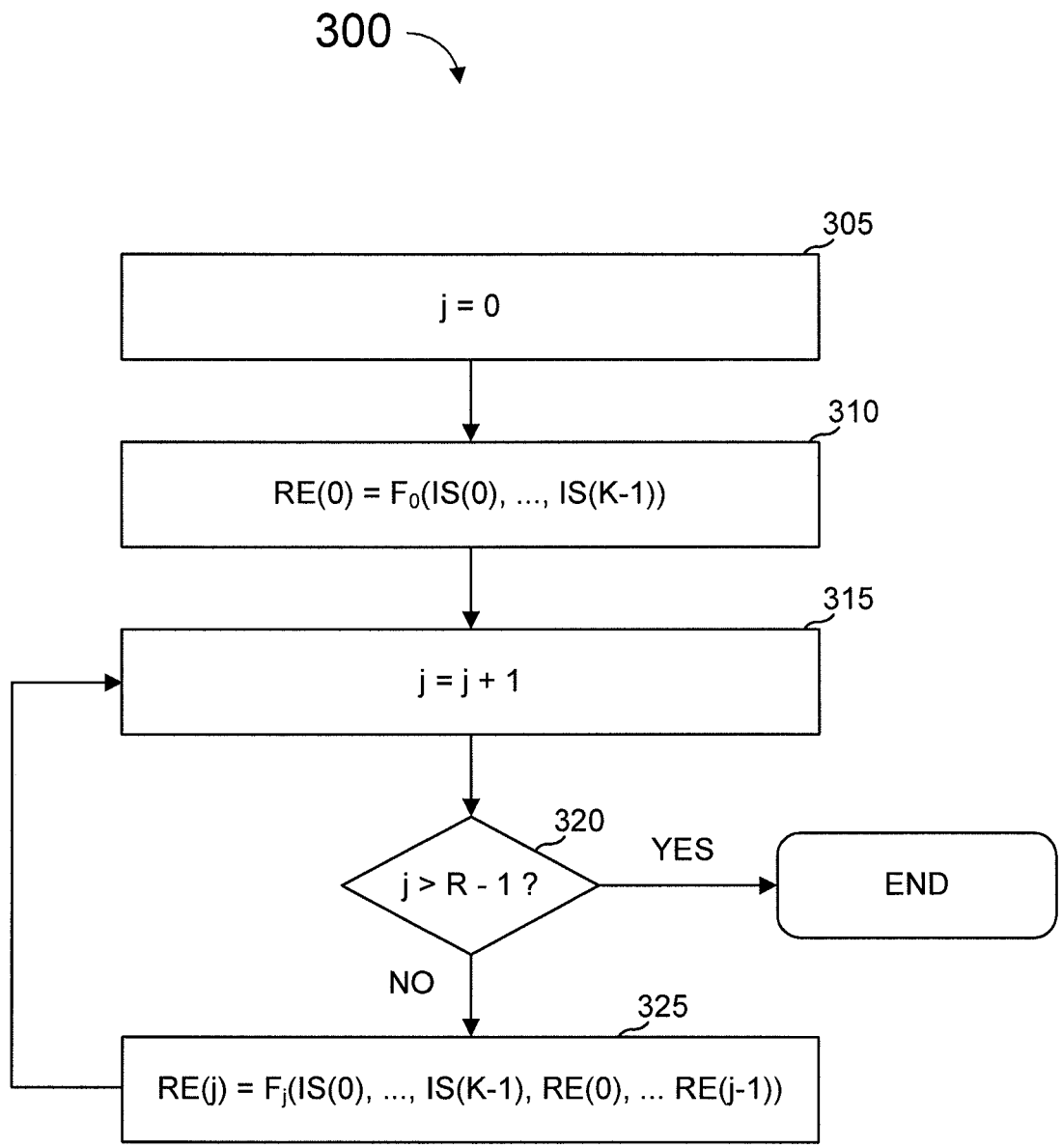
FIG. 3 is a simplified block diagram of a method of generating redundant symbols usable in the communication system of FIG. 1.
Figure 4:
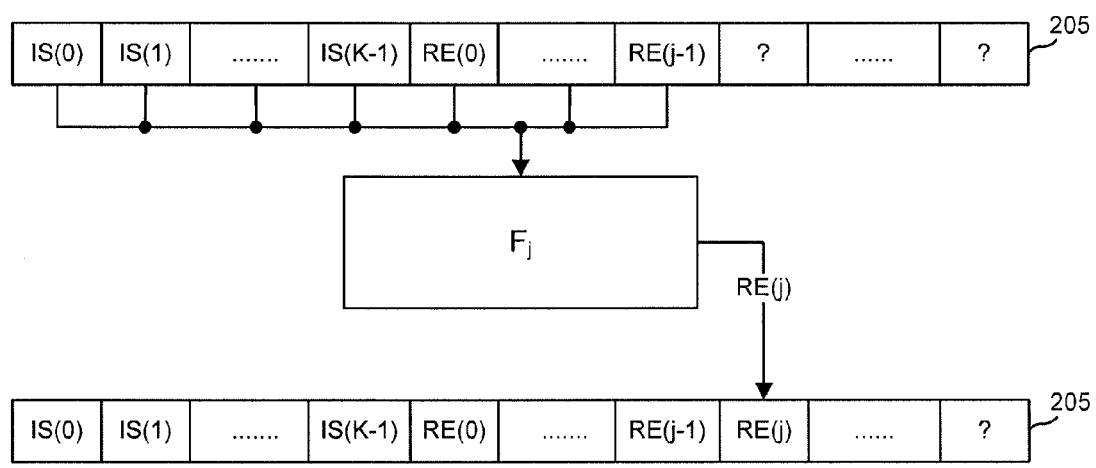
FIG. 4 is a simplified block diagram of the basic operation of a static encoder usable in the communication system of FIG. 1.

The general operation of static encoder 210 is shown with reference to FIGS. 3 and 4. FIG. 3 is a simplified flow diagram illustrating one embodiment 300 of a method of statically encoding. In a step 305, a variable j, which keeps track of how many redundant symbols have been generated, is set to zero. Then, in a step 310, a first redundant symbol RE(0) is computed as a function $F_0$ of at least some of the input symbols IS(0), . . . , IS(K−1). Then, in a step 315, the variable j is incremented. Next, in a step 320, it is tested whether all of the redundant symbols have been generated (i.e., is j greater than R−1?). If yes, then the flow ends. Otherwise, the flow proceeds to step 325. In step 325, RE(j) is computed as a function $F_j$ of the input symbols IS(0), . . . , IS(K−1) and of the previously generated redundant symbols RE(0), . . . , RE(j−1), where $F_j$ need not be a function that depends on every one of the input symbols or every one of the redundant symbols. Steps 315, 320, and 325 are repeated until R redundant symbols have been computed. In some cases $F_j$ might be such that Half-Weight symbols are generated.

Referring again to FIGS. 1 and 2, in some embodiments, static encoder 210 receives one or more static keys $S_0$, $S_1, \ldots$ from static key generator 130. In these embodiments, the static encoder 210 uses the static keys to determine some or all of functions $F_0, F_1, \ldots, F_{j-1}$. For example, static key $S_0$ can be used to determine function $F_0$, static key $S_1$ can be used to determine function $F_1$, etc. Or, one or more of static keys $S_0, S_1, \ldots$ can be used to determine function $F_0$, one or more of static keys $S_0, S_1, \ldots$ can be used to determine function $F_1$, etc. In other embodiments, no static keys are needed, and thus static key generator 130 is not needed.

Referring now to FIGS. 2 and 3, in some embodiments, the redundant symbols generated by static encoder 210 can be stored in input symbol buffer 205. FIG. 4 is a simplified illustration of the operation of one embodiment of static encoder 210. Particularly, static encoder 210 generates redundant symbol RE(j) as a function Fj of input symbols IS(0), . . . , IS(K−1), RE(0), . . . , RE(j−1), received from input symbol buffer 205, and stores it back into input symbol buffer 205. The exact form of the functions $F_0, F_1, \ldots, F_{R-1}$ depends on the particular application. Typically, but not always, functions $F_0, F_1, \ldots, F_{R-1}$ include an exclusive OR of some or all of their corresponding arguments. As described above, these functions may or may not actually employ static keys generated by static key generator 130 of FIG. 1. For example, in one specific embodiment described below, the first few functions implement a Hamming code and do not make any use of the static keys $S_0, S_1, \ldots$, whereas the remaining functions implement a Low-Density Parity-Check code and make explicit use of the static keys.

Overview of Multi-Stage Encoder

Referring again to FIG. 2, dynamic encoder 220 receives input symbols IS(0), ..., IS(K−1) and the redundant symbols RE(0), ..., RE(R−1) and a key I for each output symbol it is to generate. The collection comprising the original input symbols and the redundant symbols will be referred to as the collection of "dynamic input symbols" hereafter.

Figure 5:
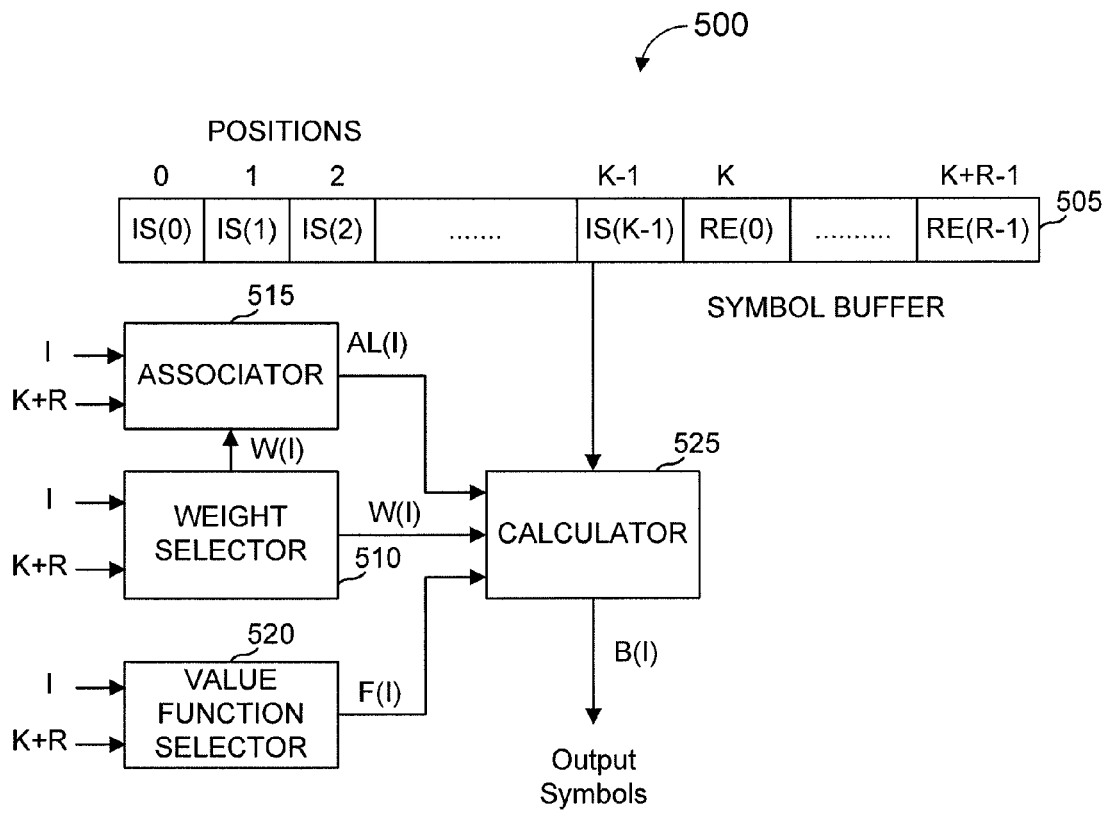
FIG. 5 is a simplified block diagram of a dynamic encoder usable in the communication system of FIG. 1.

FIG. 5 is a simplified block diagram of one embodiment of a dynamic encoder, including a weight selector 510, an associator 515, a value function selector 520 and a calculator 525. As shown in FIG. 5, the K+R dynamic input symbols are stored in a dynamic symbol buffer 505. In effect, dynamic encoder 500 performs the action illustrated in FIG. 6, namely, to generate an output symbol value B(I) as some value function of selected input symbols.

Figure 6:
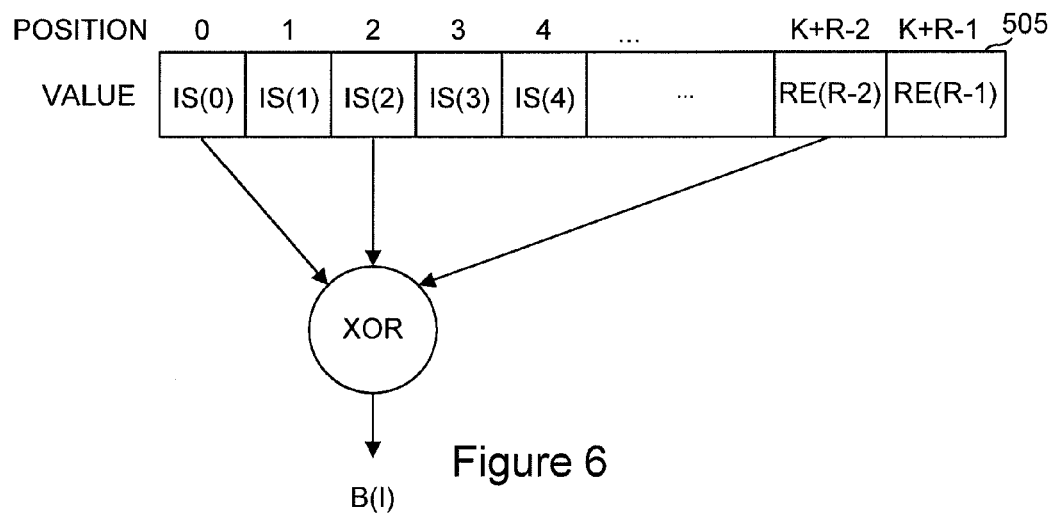
FIG. 6 is a simplified block diagram of a basic operation of a dynamic encoder usable in the communication system of FIG. 1.

FIG. 6 illustrates the action of a function used by calculator 525.

Figure 7:
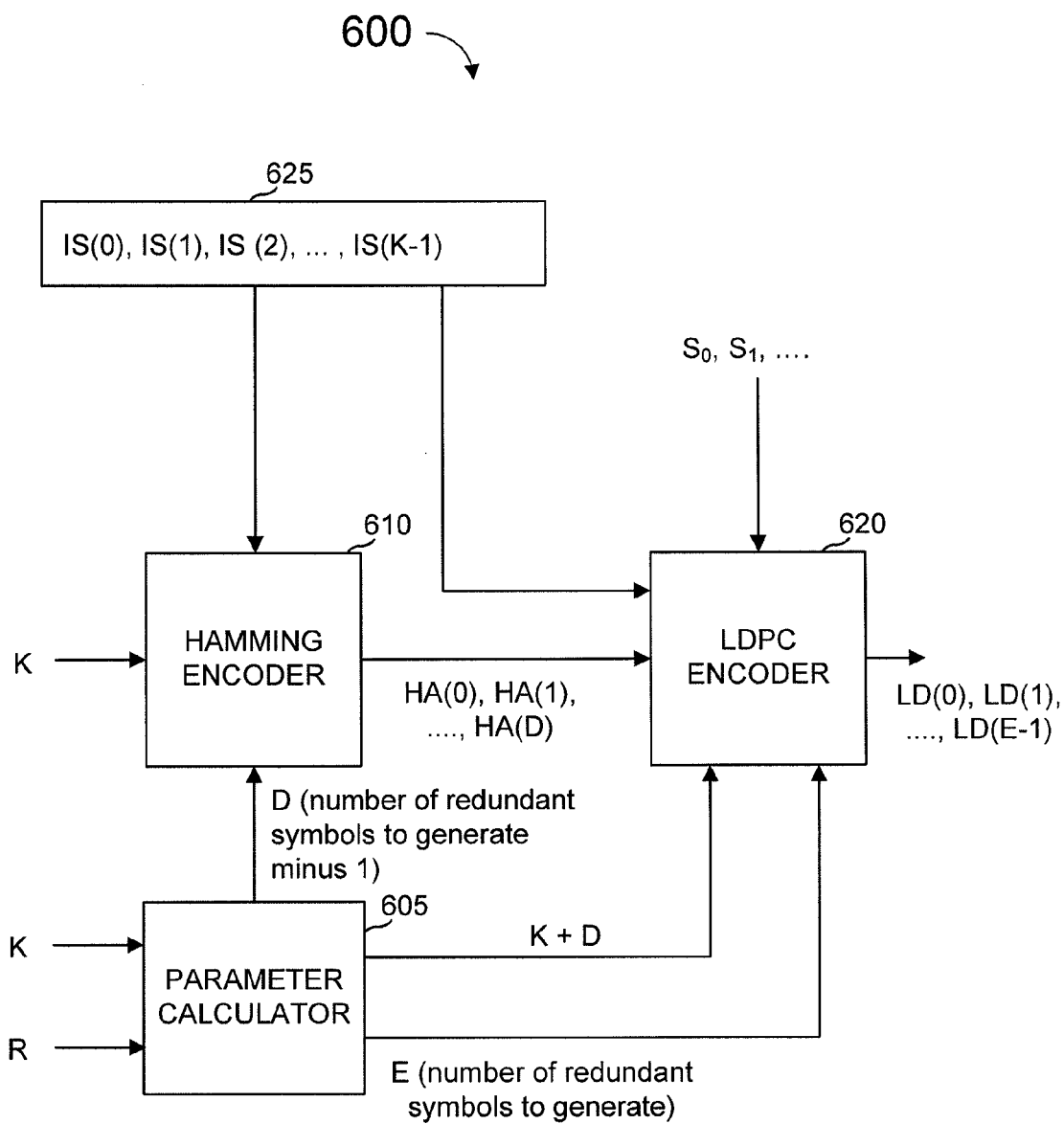
FIG. 7 is a simplified block diagram of a static encoder usable in the communication system of FIG. 1.

FIG. 7 is a simplified block diagram of one specific embodiment of a static encoder according to the present invention. Static encoder 600 comprises a parameter calculator 605, a Hamming encoder 610, and a low-density-parity-check (LDPC) encoder 620. Hamming encoder 610 is coupled to receive the input symbols IS(0), ..., IS(K−1) from an input symbol buffer 625, the number K of input symbols, and the parameter D. In response, Hamming encoder 610 generates D+1 redundant symbols HA(0), HA(1), ..., HA(D) according to a Hamming code.

Figure 8:
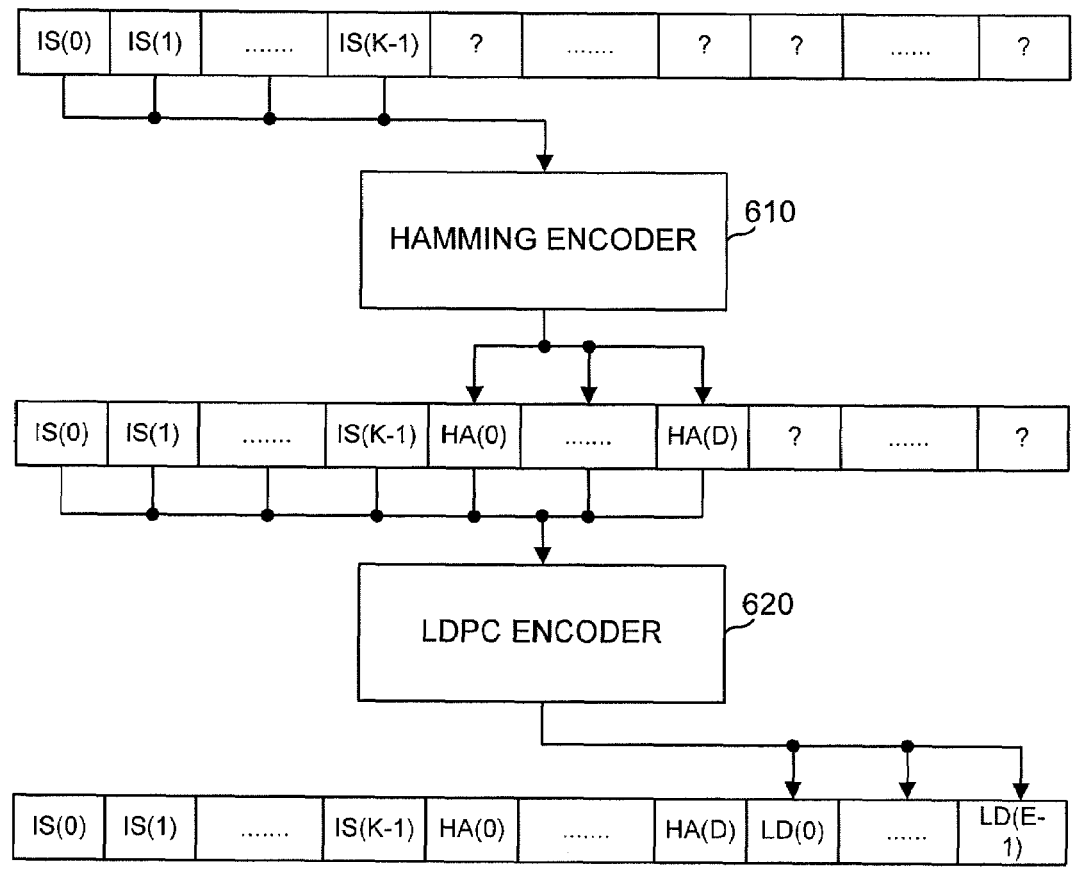
FIG. 8 is a simplified block diagram of the basic operation of a static encoder usable in the communication system of FIG. 1.

FIG. 8 illustrates the operation of one embodiment of the present invention that employs the static encoder shown in FIG. 7.

Figure 9:
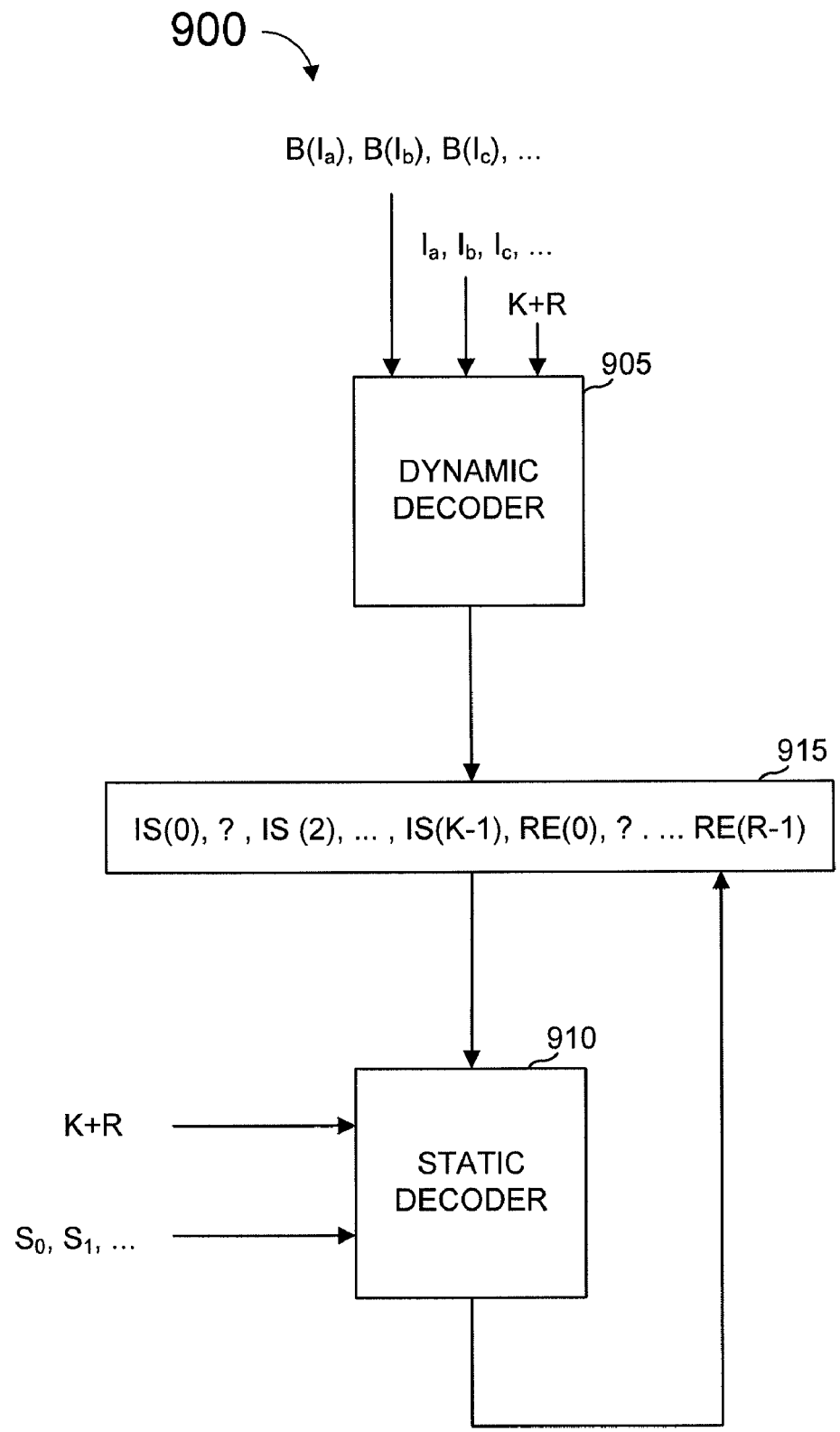
FIG. 9 is a simplified block diagram of a decoder usable in the communication system of FIG. 1.

FIG. 9 is a simplified block diagram illustrating one embodiment of a decoder according to the present invention. Decoder 900 can be used, for example, to implement decoder 155 of FIG. 1. Decoder 900 comprises a dynamic decoder 905 and a static decoder 910. Input symbols and redundant symbols recovered by dynamic decoder 905 are stored in a reconstruction buffer 915. Upon completion of dynamic decoding, static decoder 910 attempts to recover any input symbols not recovered by dynamic decoder 905, if any. In particular, static decoder 910 receives input symbols and redundant symbols from reconstruction buffer 915.

Variations

Many variations of LDPC decoders and Hamming decoders are well known to those skilled in the art, and can be employed in various embodiments according to the present invention. In one specific embodiment, a Hamming decoder is implemented using a Gaussian elimination algorithm. Many variations of Gaussian elimination algorithms are well known to those skilled in the art, and can be employed in various embodiments according to the present invention.

Multi-stage fountain codes as described above are not systematic codes, i.e., all of the original source symbols of a source block are not necessarily among the encoding symbols that are sent. However, systematic FEC codes are useful for a file download system or service, and very important for a streaming system or service. As shown in the implementation below, a modified code can be made to be systematic and still maintain the fountain code and other described properties.

One reason why it is easy to architect a variety of supplemental services using multi-stage codes is that it can combine received encoding symbols from multiple senders to reconstruct a source file or stream without coordination among the senders. The only requirement is that the senders use differing sets of keys to generate the encoding symbols that they send in encoding packets to the code. Ways to achieve this include designating different ranges of the key space to be used by each such sender, or generating keys randomly at each sender.

As an example of the use of this capability, consider providing a supplemental service to a file download service that allows multi-stage fountain codes that did not receive enough encoding packets to reconstruct a source file from the file download session to request additional encoding packets to be sent from a make-up sender, e.g., via a HTTP session. The make-up sender generates encoding symbols from the source file and sends them, for example using HTTP, and all these encoding symbols can be combined with those received from the file download session to recover the source file. Using this approach allows different senders to provide incremental source file delivery services without coordination between the senders, and ensuring that each individual receiver need receive only a minimal number of encoding packets to recover each source file.

Implementations of a MS Code Intermediate Symbol Generator Using Half-Weight Symbols For a given set of K input symbols, a static encoder may generate L intermediate symbols wherein L>K, wherein the first K of these are the input symbols (in the case of a systematic encoder) and the remaining L−K intermediate symbols are redundant symbols including Half-Weight symbols. The intermediate symbols are such that the input symbols can be recovered from the intermediate symbols. The source symbols used as input to a dynamic encoder can comprise some, all or none of the intermediate symbols (and/or the input symbols if these are not part of the intermediate symbols).

A dynamic encoder generates output symbols from the source symbols. Where the dynamic encoder is a fountain or fountain encoder, the code rate can be "rateless" and as many output symbols can be generated as needed without having to resort to repeating information duplicative symbols.

Intermediate symbols are generated using an inverse encoding process. The output symbols do not need to include the intermediate symbols, i.e., intermediate symbols are not included in data packets. A source block is sometime broken into sub-blocks, each of which is sufficiently small to be decoded in working memory. For a source block comprising K source symbols, each sub-block comprises K sub-symbols, wherein each symbol of the source block comprises one sub-symbol from each sub-block.

Generating Intermediate Symbols Including Half-Weight Symbols

A method and apparatus for generating intermediate symbols including Half-Weight symbols will now be described. A Half-Weight symbol is a symbol that depends on approximately half of the source symbols, such as being an XOR of approximately half of the source symbols and wherein each symbol lends a dependency to about half of the Half-Weight symbols. Where the number of source symbols and the number of Half-Weight symbols are both divisible by two, it might be such that exactly half of the Half-Weight symbols depend from any one source symbol and each of the Half-Weight symbols depend on exactly half of the source symbols. The graph mapping source symbols on one side to Half-Weight symbols on the other side might be generated using a Gray sequence.

Values for a set of intermediate symbols are derived from the original input symbols such that knowledge of the intermediate symbols is sufficient to reconstruct the input symbols. With multiple stages, an encoder might produce redundant symbols that are each a function (such as the exclusive OR, or "XOR") of a number of the intermediate symbols. The redundant symbols are produced in such a way that the intermediate symbols, and therefore also the source symbols, can be recovered from any sufficiently large set of output symbols, typically just the amount of data representing the original data plus some small extra amount. The intermediate symbols might comprise source symbols, Half-Weight symbols, or the like.

Luby-Prov teaches the use of a systematic code encoder wherein a number of decoding algorithms are possible, along with some decoding algorithms. As taught there, construction of intermediate and repair symbols is based in part on a pseudo-random number generator based on a fixed set of random numbers that are available to both sender and receiver. The construction of the intermediate symbols from the source symbols might be governed by a systematic index.

A pre-coder might be programmed or constructed to generate L intermediate symbols from K input symbols (L>K where the symbols are the same size). In this example, the first K intermediate symbols are the K input symbols being pre-coded for and the last L-K intermediate symbols are generated in terms of the first K intermediate symbols. The first K intermediate symbols might be generated in some other manner.

The last L-K intermediate symbols $C[K], \ldots, C[L-1]$ might comprise S LDPC symbols and H Half-Weight symbols. The values of S and H are determined from K as described below, wherein $L=K+S+H$. Let X be the smallest positive integer such that $X \cdot (X-1) = 2 \cdot K$ and let S be the smallest prime integer such that $S \geq \text{ceil}(0.01 \cdot K) + X$, where the function ceil(x) denotes the smallest positive integer which is greater than or equal to x. Then, determine H such that it is the smallest integer such that choose(H, ceil(H/2))$\geq$K+S, where the function choose(i, j) denotes the number of ways j objects can be chosen from among i objects without repetition.

Next, determine the Half-Weight symbols using a process wherein H'=ceil(H/2). Let:

$C[0], \ldots, C[K-1]$ denote the first K intermediate symbols $C[K], \ldots, C[K+S-1]$ denote the S LDPC symbols, initialized to zero.

$C[K+S], \ldots, C[L-1]$ denote the H Half-Weight symbols, initialized to zero.

The S LDPC symbols are defined to be the values of $C[K], \ldots, C[K+S-1]$ at the end of the following process, wherein floor(x) denotes the largest positive integer which is less than or equal to x, "i % j" denotes i modulo j, and X^Y denotes, for equal-length bit strings X and Y, the bitwise exclusive-or of X and Y:

For $i=0, \ldots, K-1$ do $a = 1 + (\text{floor}(i/S) \% (S-1))$ $b = i \% S$ $C[K+b] = C[K+b] \hat{} C[i]$ $b = (b+a) \% S$ $C[K+b] = C[K+b] \hat{} C[i]$ $b = (b+a) \% S$ $C[K+b] = C[K+b] \hat{} C[i]$ The H Half-Weight symbols are defined as follows:

Let $g[i] = i\hat{}(\text{floor}(i/2))$ for all positive integers i, wherein g[i] is a Gray sequence in which each element differs from the previous one in a single bit position. Let g[j, k] denote the $j^{th}$ element, $j=0, 1, 2, \ldots$, etc. of the subsequence of g[i] whose elements have exactly k non-zero bits in their binary representation. Then, the Half-Weight symbols are defined as the values of $C[K+S], \ldots, C[L-1]$ after the following process:

For $h=0, \ldots, H-1$ do

For $j=0, \ldots, K+S-1$ do

If bit $h$ of g[j, H'] is equal to 1, then $C[h+K+S] = C[h+K+S] \hat{} C[j]$.

A more efficient method and apparatus will now be described for quickly generating the Half-Weight symbols.

Efficient Half-Weight Code Encoders/Decoders

An encoder for Half-Weight codes computes, for a sequence of k source symbols, a plurality of h Half-Weight symbols. Each of these Half-Weight symbols is the XOR of some of the source symbols, where generally the lengths of all the symbols are the same. These Half-Weight symbols can be used as intermediate symbols that provide input to a dynamic encoder. We use matrix notation to describe which source symbols are XORed to yield a given Half-Weight symbol.

A Gray code sequence g[·] is used to describe the relationship between the source symbols and the Half-Weight symbols generated from the source symbols. To illustrate the concept, we use the following particular Gray code. For all positive integers i, let g[i] be defined as follows. Let b[i] be the highest order bit that is different in the binary representation of i−1 and i. Then, the binary representation of g[i] is obtained by flipping bit b[i] of g[i−1]. FIG. 10 shows the first few elements of a Gray code sequence generated according to this rule. Note that g[·] has the property that each pair of consecutive elements in the sequence differ in exactly one bit position. Note also that there are other Gray code sequences besides the ones described here that would be equally suitable as the basis for a Half-Weight code.

We also use the function cnt[i], where cnt[i] returns the number of bits that are set to one in the binary representation of i. For example, if i=25 in decimal, then its binary representation is 11001, and thus cnt[25]=3.

For any fixed positive integer j, let g[·, j] be the subsequence of g[·] where for each element in the sequence exactly j bits are set to 1. Thus, g[·, j] can be defined based on g[·] as follows:

Initialize c=0, i=0

Do forever

While $(cnt(g[c]) \neq j)$ $c = c+1$ $g[i, j] = g[c]$ $c = c+1$ $i = i+1$

Thus, for example, for j=3, g[0,3]=g[5]=7, g[1,3]=g[9]=13, g[2,3]=g[11]=14, g[3,3]=g[13]=11, g[4,3]=g[17]=25, etc. Note that g[·,j] has the property that each pair of consecutive elements in the sequence differ in exactly two bit positions in their binary representation. For all $i \geq 1$, let Pos1[i,j] be one of the two bit positions in which g[i,j] and g[i−1,j] differ and let Pos2[i,j] be the other bit position in which they differ. Thus, for example, Pos1[4,3]=1 and Pos2[4,3]=4.

Let $(x_0, x_1, \ldots, x_{k-1})$ denote the sequence of k source symbols, and let $(y_0, y_1, \ldots, y_{h-1})$ denote the sequence of Half-Weight symbols, where h satisfies Equation 1. The relationship between the source symbols and the h Half-Weight symbols can be represented as shown in FIG. 11 by a matrix H with k rows and h columns with each entry being 0 or 1 such that the Half-Weight symbols can be calculated from the source symbols using Equation 2.

$$(x_0, x_1, \ldots, x_{k-1}) \cdot H = (y_0, y_1, \ldots, y_{h-1}) \quad \text{(Equ. 2)}$$

In Equation 2, if H[l, k] denotes the entry of the matrix H at position (l, k), then $y_j$ is equal to $H[0,j] \cdot x_0 \oplus H[1,j] \cdot x_1 \oplus \ldots \oplus H[k-1,j] \cdot x_{k-1}$, wherein the symbol "$\oplus$" is used to denote the XOR operation. Herein, $H[l,j] \cdot x_l$ is defined as 0 if $H[l,j]=0$, and as $x_l$ if $H[l,j]=1$.

The matrix H has a special form that can be described as follows. Let h'=ceil(h/2), i.e., h' is equal to h/2 rounded up to the nearest integer. The matrix H is the k by h matrix in which the rows are indexed from 0 to k−1, where row i is equal to the binary representation of g[i,h']. For example, when k=7, we have h=5 (from Equ. 1) and h'=3, the corresponding matrix H is as shown in FIG. 11I. In this example, the seven rows of the matrix are indexed 0 through 6 and the entries in the rows correspond to the binary representations of the integers 7, 13, 14, 11, 25, 26, and 28.

In a straightforward calculation of the product in Equation 2, the number of XORs of source symbols performed for calculating each Half-Weight symbol $y_i$ for i=0, 1, . . . , h−1 is one less than the number of ones in the column corresponding to i in the matrix H. Since H has exactly k·h' ones, the number of XORs of source symbols performed by the straightforward method is k·(h'−1), where h' is of the order of log(k).

An Embodiment of an Efficient Method for Computing Half-Weight Symbols

We present a method by which the Half-Weight symbols can be calculated with at most 3·(k−1)+h'+1 XORs of symbols.

Figure 12:
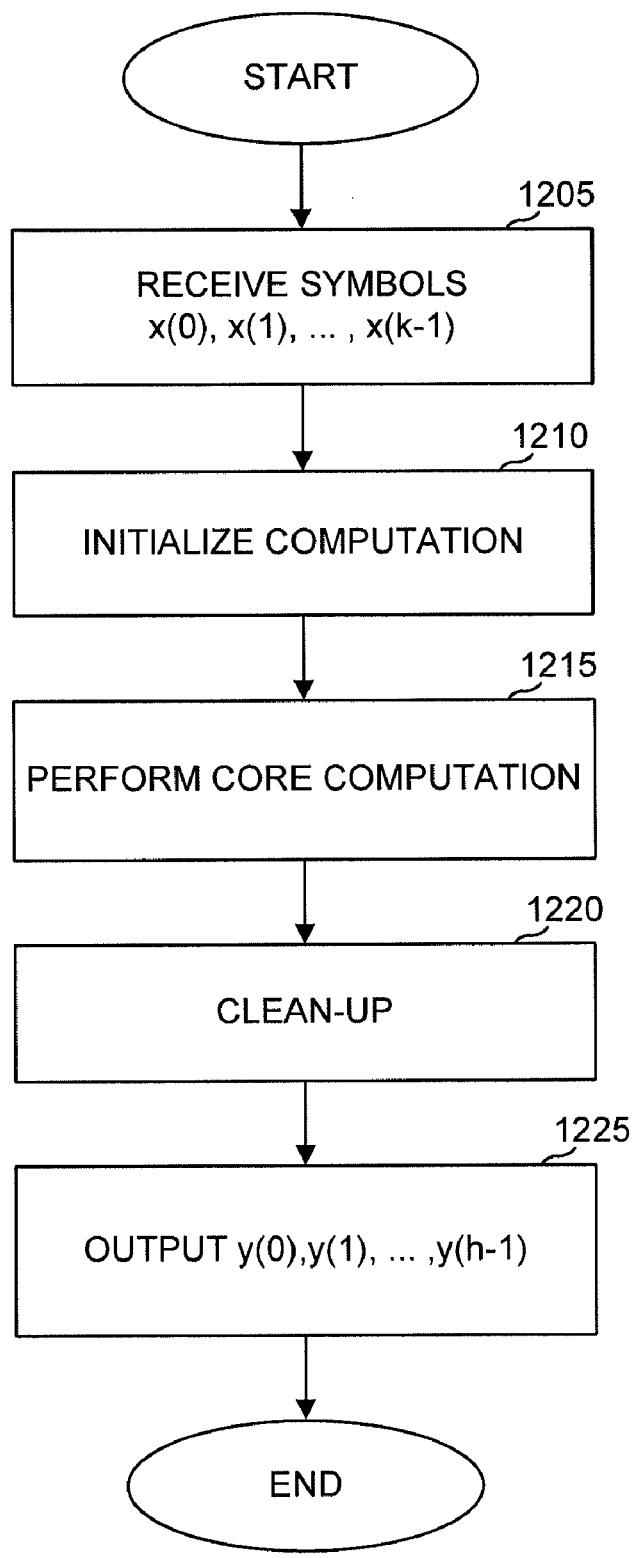
FIG. 12 is a flowchart of an overall efficient method for encoding a Half-Weight code according to embodiments of the present invention.

An exemplary embodiment of an efficient method for calculation of Half-Weight symbols is shown in FIG. 12. The method comprises three phases: an Initialize Computation phase shown in step 1210, a Perform Core Computation phase shown in step 1215, and a Clean Up phase shown in step 1220. Other variations are possible. The method starts by receiving the source symbols $x_0, x_1, \ldots, x_{k-1}$ in step 1205, performs the phases shown in steps 1210, 1215, and 1220 on the source symbols, and outputs the Half-Weight symbols $y_0, y_1, \ldots, y_{h-1}$ in step 1225.

Figure 13:
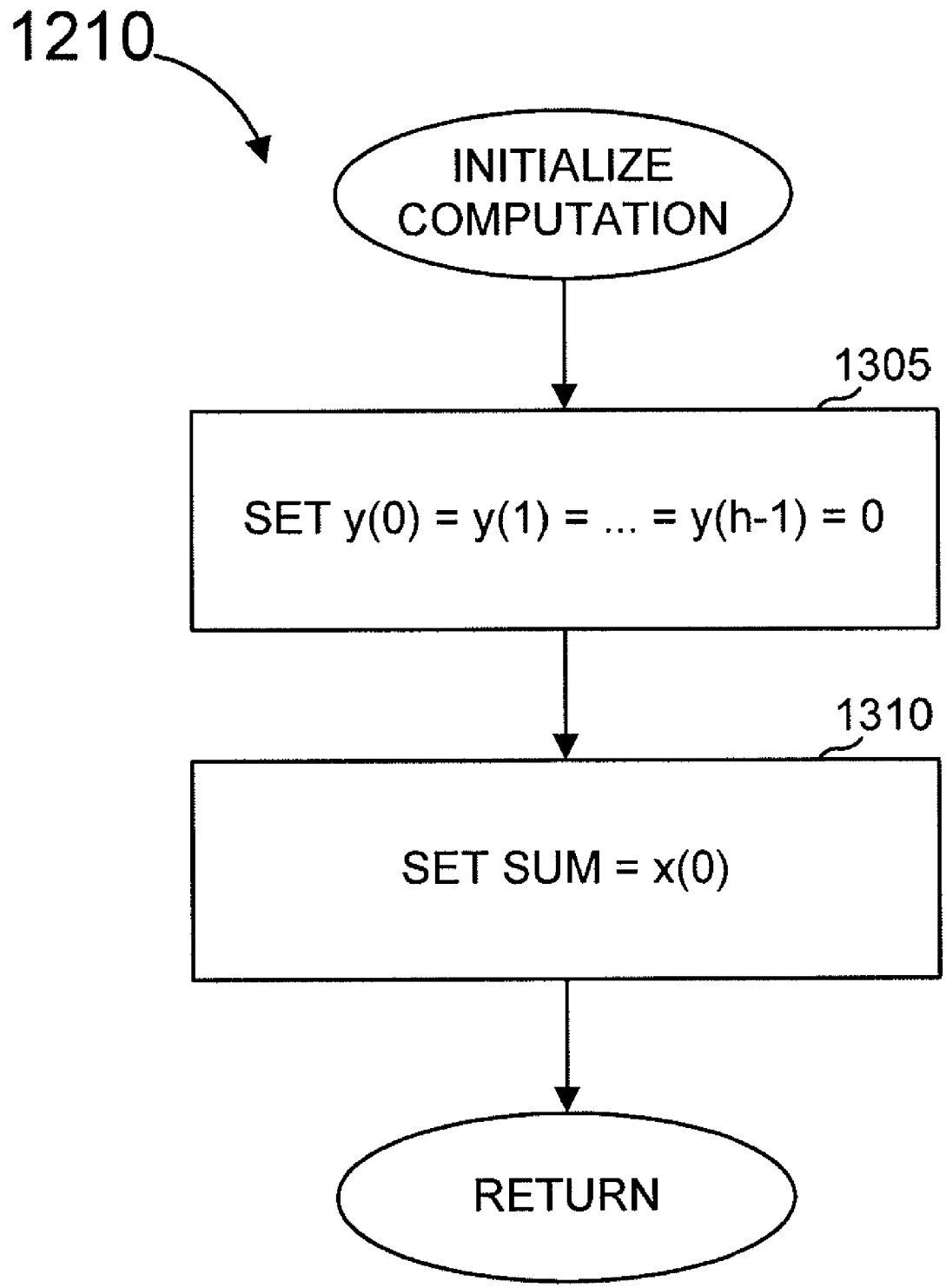
FIG. 13 is a flowchart of a method for implementing the Initialize Computation phase of FIG. 12.

An exemplary embodiment of the Initialize Computation phase 1210 of FIG. 12 is shown in FIG. 13. The Initialize Computation phase 1210 shown in FIG. 13 comprises two steps. Step 1305 initializes the values of each of the Half-Weight symbols to zero. The second Step 1310 initializes the value of a symbol variable SUM to $x_0$. During the Perform Core Computation phase 1215 of FIG. 12, the value of SUM will be the XOR of all the source symbols visited during the execution of the process.

Figure 14:
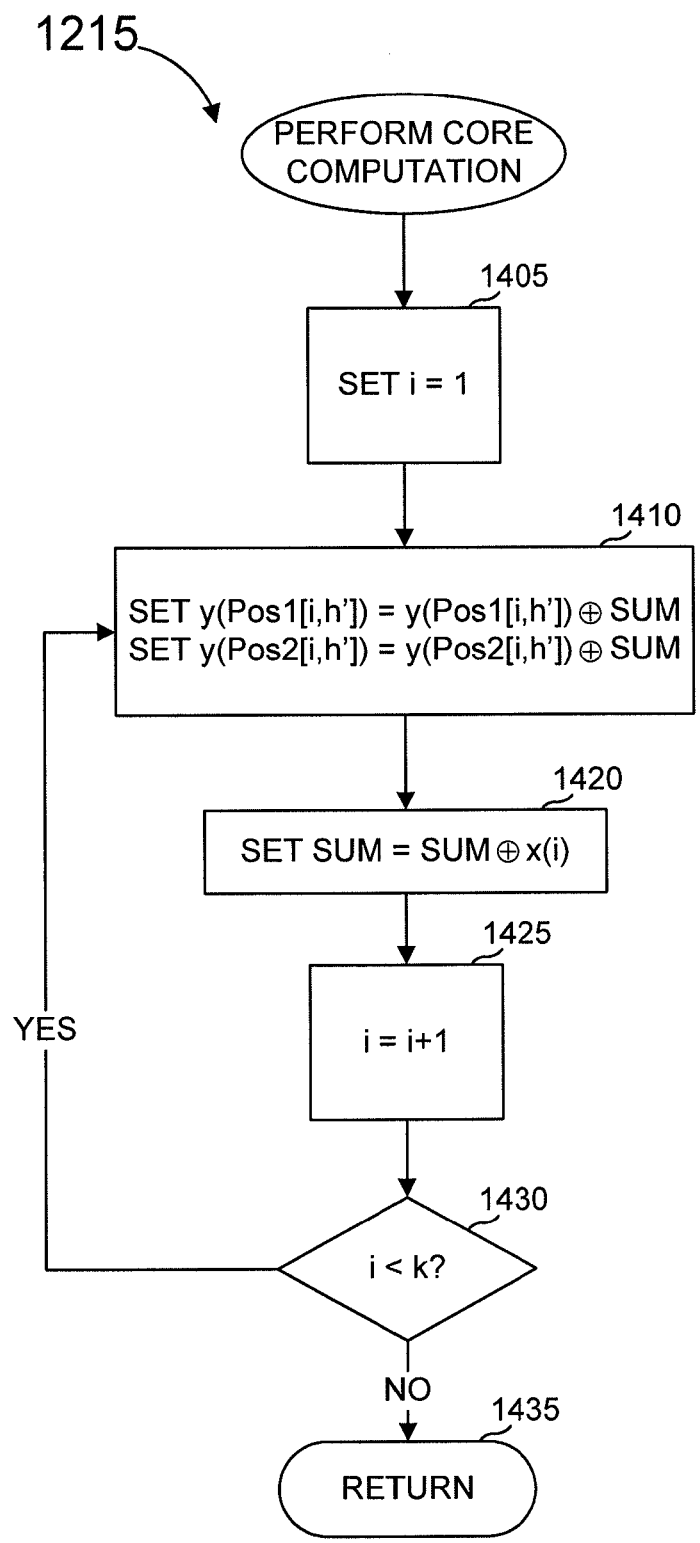
FIG. 14 is a flowchart of a method for implementing the Perform Core Computation phase of FIG. 12.

FIG. 14 shows one exemplary embodiment of the Perform Core Computation phase 1215 of FIG. 12. The overall structure of this phase is a loop over the source symbols $x_1, x_2, \ldots, x_{k-1}$. A variable i keeps track of the indices of these symbols, and is, accordingly, initialized to one in 1405. In Step 1410, the value of SUM is XORed into the two Half-Weight symbols indexed by Pos1[i,h'] and Pos2[i,h'].

The functions Pos1[i,h'] and Pos2[i,h'] can be calculated in a variety of ways, as is well known to those of skill in the art. For example, one way to do this is to explicitly calculate for consecutive indices of i the g[i,h'] sequence, and then calculate Pos1[i,h'] and Pos2[i,h'] based on the two positions where g[i−1,h'] and g[i,h'] differ in their binary representation. As another example, J. R. Bitner, G. Ehrlich, E. M. Reingold, "Efficient generation of the binary reflected Gray code", Communications of the ACM (1976) describes an efficient process that requires only a constant number of operations on standard central processing units to calculate each consecutive value of Pos1[i,h'] and Pos2[i,h'] for a fixed value of h'. As another example, a lookup table might be used to hold pre-computed values of Pos1[i,h'] and Pos2[i,h'] for indices i= 1, . . . , K−1 and h'=1, . . . , H', where K' is an upper-bound on values of k to be used and H' is an upper-bound on values of h' to be used.

In step 1420, the value of $x_i$ is XORed into SUM to update the value of SUM. This update ensures that SUM remains the XOR of the values of all of the $x_i$ visited so far.

The counter i is incremented by one in step 1425. In step 1430, the value of i is compared to k, and if i<k, then steps 1410 through 1430 are repeated, whereas if i is equal to k, then the loop terminates at step 1435, and the process continues with the Clean Up phase 1220.

Figure 15:
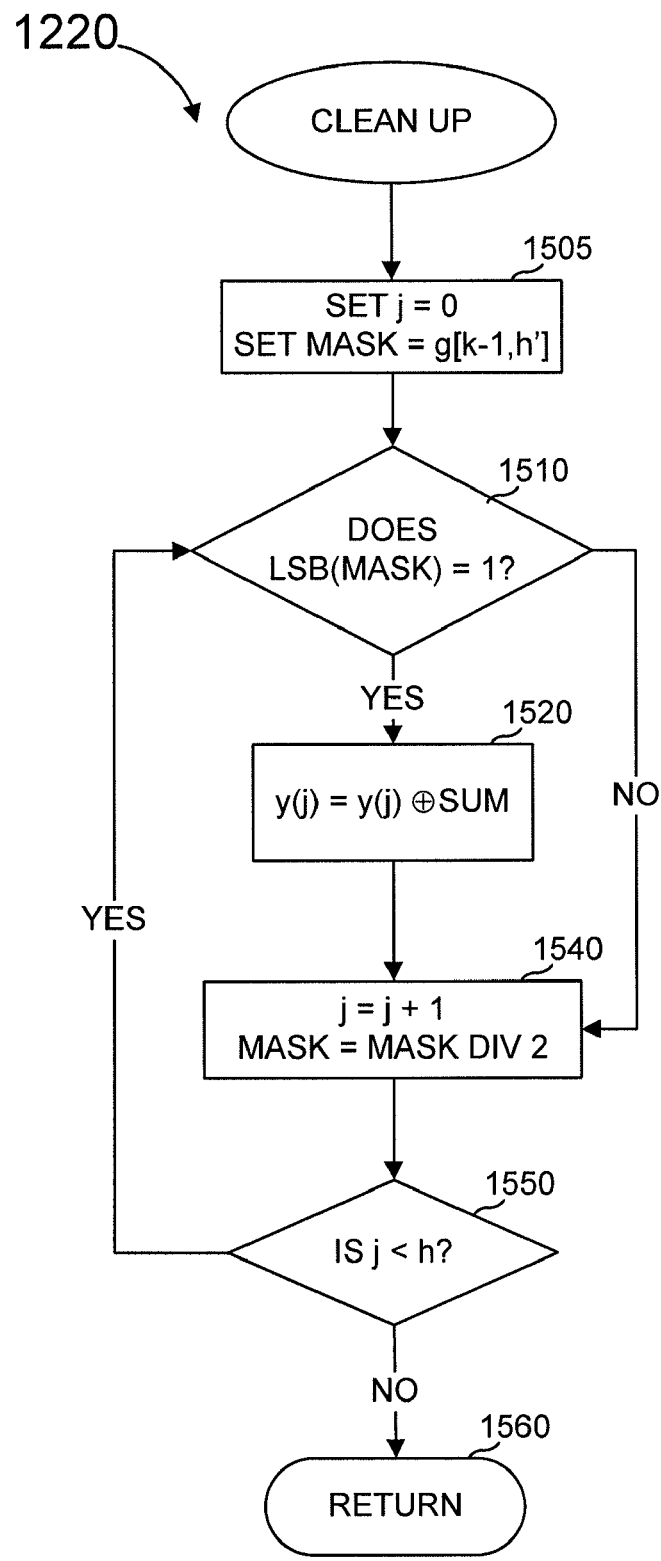
FIG. 15 is a flowchart of a method for implementing the Clean Up phase of FIG. 12.

An exemplary embodiment of the Clean Up phase 1220 is shown in FIG. 15. This phase comprises an initialization step 1505 and a computation that loops through values of a variable j ranging from 0 to h−1. The computation loop encompasses steps 1510 through 1550 in FIG. 15. In the initialization step 1505 the value of j is initialized to zero and the value of MASK is initialized to g[k−1,h'].

In Step 1510 of the computation loop, it is checked whether the least significant bit of the binary representation of MASK is equal to 1, and if the test is true, then the next is step 1520. In step 1520, the value of $y_j$ is updated by XORing it with the value of SUM, and the process continues with step 1540.

If the result of the test in Step 1510 is false, then the process jumps directly to step 1540. In step 1540, the value of j is incremented by one and the least significant bit of MASK is shifted out of MASK, where this shift is implemented by the DIV operator comprising dividing MASK by two and dropping the remainder. This second part of step 1540 could be implemented in a variety of ways, including for example applying a shift operator to MASK. Step 1550 checks to see if j<h, and if j<h then processing returns to step 1510, but if this condition is not true then processing stops at step 1560. Each of these steps can be performed by digital logic, software or other physical computation device.

One skilled in the art will recognize after reading this disclosure that there are other alternative methods to those shown in FIGS. 12, 13, 14 and 15 for efficient computation of the Half-Weight symbols.

Calculating Several Sets of Half-Weight Symbols

As was mentioned above, one of the reasons for using the Half-Weight code is the excellent erasure correction capability of this code. In certain applications, however, it is important to protect the data with more redundant symbols than a Half-Weight code is capable of producing. This is particularly important when the redundant symbols are used to decrease the error in a probabilistic decoding algorithm, such as those described in Shokrollahi I. For this reason, a variation of using Half-Weight codes is described herein that is capable of producing several sets of redundant symbols, wherein each set of redundant symbols has the same number of redundant symbols as the Half-Weight code. This encoder is referred to as the "parallel Half-Weight encoder" herein.

Denoting again by k the number of source symbols to the parallel Half-Weight encoder, and by s the number of sets of independent Half-Weight symbols that are to be generated, the method starts by calculating s random or pseudorandom permutations of the integers 0, 1, ..., k−1. There are a number of ways to calculate these permutations, as is well known to those of skill in the art.

In some embodiments, one property of these permutations is that they are easy to calculate, i.e., it is easy to determine for any given j in among the integers 0, 1, ..., k−1, what the image of j under the permutation is. For example, where k is a prime number, one of the many possibilities for this permutation can be to independently choose two random integers a and b, where a is chosen uniformly at random in the range 1, 2, ..., k−1, and b is independently chosen at random in the range 0, 1, ..., k−1. Then, the image of j under the permutation defined by a and b is defined as a·j+b modulo the integer k. In other words, this image is the remainder of the division of a·j+b by k.

If k is not a prime number, then the numbers a and b can be chosen by choosing a uniformly at random from the set of positive integers less than k which do not have a common divisor with k, while b can be chosen uniformly at random in the range 0, 1, ..., k−1 as before. Various other methods for generating permutations can be envisioned by those of skill in the art upon studying this application, and the method described below does not depend on the specific choice of the permutations, except that in preferred applications it is desirable to have s different permutations.

Returning to the description of the parallel Half-Weight encoder, the encoder generates s random or pseudorandom permutations, denoted $\pi_1, \pi_2, \ldots, \pi_s$. There will be s sets of redundant Half-Weight symbols denoted $y_{0,0}, y_{0,1}, \ldots, y_{0,h-1}$; $y_{1,0}, y_{1,1}, \ldots, y_{1,h-1}; \ldots; y_{s-1,0}, y_{s-1,1}, \ldots, y_{s-1,h-1}$. As before, h is the smallest positive integer that satisfies Equation 1. The generation of the redundant symbols of the parallel Half-Weight encoder is done one set at a time.

To generate the jth set, where j=0, 1, ..., s−1, the encoder proceeds in a similar manner as the original Half-Weight encoder described above. The encoder might comprise three phases, similar to those shown in FIG. 12, with a modification for parallel operation of step 1420, when updating the value of SUM. In the parallel encoder, the value of SUM is updated as SUM=SUM⊕x($\pi_j$(i)) for the jth set.

Using the Fast Encoder for Recovering from Erasures

A decoder described in Shokrollahi I might be used to recover the original source symbols from the received dynamic symbols. If a Half-Weight code is used by the encoder, one of the steps in the decoding process in some embodiments is to recover some of the symbols involved in a Half-Weight code based on the recovery of the remainder of the symbols involved in the Half-Weight code. The Half-Weight code has the property that with high probability any combination of r≦h missing symbols can be recovered if the remaining symbols among the k+h symbols $y_0, y_1, \ldots, y_{h-1}$ and $x_0, x_1, \ldots, x_{k-1}$ have already been recovered. When used in conjunction with an Inactivation Decoder or other decoder wherein a Gaussian Elimination of the decoding matrix is performed, then the Half-Weight code has the property that addition of the Half-Weight rows to the decoding matrix formed from the other decoding stages in a multi-stage decoder will result in a matrix of full rank, with high probability, and hence reduce the error probability of the decoder.

The relationship between a missing set of r symbols $z_0$ can be efficiently calculated using at most 3·(k−1)+h/2+1 XORs of symbols given the values of the remaining t=k+h−r symbols, using a variant of the efficient method for calculating the Half-Weight code disclosed above. This can dramatically speed up the overall decoding time, since this avoids using k·log(k) XORs of symbols to calculate the relationships between the r missing symbols based on a variant of the straightforward method of calculating the Half-Weight code.

Such a variant comprises making the following changes to the Half-Weight encoding method described in FIGS. 12, 13, 14 and 15. In step 1205 of FIG. 12, the symbols received are the t symbols among the k+h source and Half-Weight symbols. In step 1305 of FIG. 13, the missing Half-Weight symbols are initialized to zero and the remaining received Half-Weight symbols retain their received values. In step 1310 of FIG. 13, if source symbol $x_0$ is among the received source symbols, then SUM is set to $x_0$, and if $x_0$ is among the missing source symbols, then SUM is initialized to zero. In step 1420 of FIG. 14, if $x_i$ is among the received source symbols, then SUM is updated as described in step 1420, and if $x_i$ is among the missing source symbols, then SUM is left unchanged. Suppose r' of the source symbols are missing and r" of the Half-Weight symbols are missing, and thus r'+r"=r. Then, in step 1225 of FIG. 12, the dependency on the k−r' received source symbol of the h−r" received Half-Weight symbols has been removed, and thus the h−r" received Half-Weight symbol values depend only on the missing r' source symbols. Thereafter, a process that can solve the small system of equations involving the h−r" received Half-Weight symbols and the missing r' source symbols can be used to recover the missing r' source symbol values. Examples of such systems of equations should be apparent after review of this disclosure.

As one skilled in the art will recognize, there are many other variants of the above efficient decoding method. For example, in step 1410 of FIG. 14, one variant is to skip updates of missing Half-Symbol values, thus making the overall computation somewhat more efficient. As another variant, the missing Half-Symbol updates are not skipped in step 1410 of FIG. 14, and then in step 1225 of FIG. 12, the Half-Symbol values corresponding to missing Half-Symbols only depend on the missing source symbol values and their own missing value, and these equations may be useful for other part of an overall decoding process, e.g., if there are other equations that involve the missing Half-Symbols and missing source symbols from other parts of an overall code. This is the case, for example, when using an Inactivation Decoder with a multi-stage code.

In most of the examples described above, the input and output symbols encode for the same number of bits and each output symbol is placed in one packet (a packet being a unit of transport that is either received in its entirety or lost in its entirety). In some embodiments, the communications system is modified so that each packet contains several output symbols. The size of an output symbol value is then set to a size determined by the size of the input symbol values in the initial splitting of the file or blocks of the stream into input symbols, based on a number of factors. The decoding process remains essentially unchanged, except that output symbols arrive in bunches as each packet is received.

The setting of input symbol and output symbol sizes is usually dictated by the size of the file or block of the stream and the communication system over which the output symbols are to be transmitted. For example, if a communication system groups bits of data into packets of a defined size or groups bits in other ways, the design of symbol sizes begins with the packet or grouping size. From there, a designer would determine how many output symbols will be carried in one packet or group and that determines the output symbol size. For simplicity, the designer would likely set the input symbol size equal to the output symbol size, but if the input data makes a different input symbol size more convenient, it can be used.

The above described encoding process produces a stream of packets containing output symbols based on the original file or block of the stream. Each output symbol in the stream is generated independently of all other output symbols, and there is no lower or upper bound on the number of output symbols that can be created. A key is associated with each output symbol. That key, and some contents of the input file or block of the stream, determines the value of the output symbol. Consecutively generated output symbols need not have consecutive keys, and in some applications it would be preferable to randomly generate the sequence of keys, or pseudo-randomly generate the sequence.

Multi-stage decoding has a property that if the original file or block of the stream can be split into K equal sized input symbols and each output symbol value is the same length as an input symbol value, then the file or block can be recovered from K+A output symbols on average, with very high probability, where A is small compared to K. For example, for the weight distributions introduced above, the probability that the value of A exceeds $\alpha*K$ is at most $10^{-12}$ if K is larger than 19,681, and it is at most $10^{-10}$ for any value of K. Since the particular output symbols are generated in a random or pseudorandom order, and the loss of particular output symbols in transit is assumed random, some small variance exists in the actual number of output symbols needed to recover the input file or block. In some cases, where a particular collection of K+A packets are not enough to decode the entire input file or block, the input file or block is still recoverable if the receiver can gather more packets from one or more sources of output packets.

Because the number of output symbols is only limited by the resolution of I, well more than K+A output symbols can be generated. For example, if I is a 32 bit number, 4 billion different output symbols could be generated, whereas the file or block of the stream could include K=50,000 input symbols. In some applications, only a small number of those 4 billion output symbols may be generated and transmitted and it is a near certainty that an input file or block of a stream can be recovered with a very small fraction of the possible output symbols and an excellent probability that the input file or block can be recovered with slightly more than K output symbols (assuming that the input symbol size is the same as the output symbol size).

In some applications, it may be acceptable to not be able to decode all of the input symbols, or to be able to decode all of input symbols, but with a relatively low probability. In such applications, a receiver can stop attempting to decode all of the input symbols after receiving K+A output symbols. Or, the receiver can stop receiving output symbols after receiving less than K+A output symbols. In some applications, the receiver may even only receive K or less output symbols. Thus, it is to be understood that in some embodiments of the present invention, the desired degree of accuracy need not be complete recovery of all the input symbols.

Further, in some applications where incomplete recovery is acceptable, the data can be encoded such that all of the input symbols cannot be recovered, or such that complete recovery of the input symbols would require reception of many more output symbols than the number of input symbols. Such an encoding would generally require less computational expense, and may thus be an acceptable way to decrease the computational expense of encoding.

It is to be understood that the various functional blocks in the above described figures may be implemented by a combination of hardware and/or software, and that in specific implementations some or all of the functionality of some of the blocks may be combined. Similarly, it is also to be understood that the various methods described herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of encoding data for transmission from a source to a destination over a communications channel using an encoder having an input to receive signals representative of a plurality of input symbols and an output for a plurality of encoded output symbols, wherein the plurality of input symbols are encoded into the plurality of encoded output symbols using a half-weight code comprising:

accessing a set of k input symbols;

generating redundant symbols from at least some of the set of k input symbols, including a plurality of h Half-Weight symbols using on the order of $(3 \cdot (k-1)) + (\log_2(k)/2) + 1$ XOR symbol operations, where h is on the order of $\log(k)$; and generating encoded symbols from at least the redundant symbols including the plurality of h Half-Weight symbols, using a dynamic encoder that generates encoded symbols as needed.

2. The method of claim 1, where generating encoded symbols comprises generating encoded symbols from the redundant symbols and at least some of the input symbols.

3. The method of claim 1, wherein the dynamic encoder is a fountain encoder capable of generating encoded symbols such that more distinct encoded symbols can be feasibly generated than would be expected given expected transmission conditions and number of input symbols.

4. The method of claim 1, wherein the number of XOR symbol operations is not greater than a predetermined constant times k+h.

5. The method of claim 1, where the number of XOR symbol operations is not greater than a predetermined constant times k+h.

6. The method of claim 1, comprising generating the plurality of h Half Weight symbols in parallel.

* * * * *